United States Patent [19]
Pascucci

[11] Patent Number: 6,081,911
[45] Date of Patent: Jun. 27, 2000

[54] METHOD AND CIRCUIT ARCHITECTURE FOR TESTING A NON-VOLATILE MEMORY DEVICE

[75] Inventor: Luigi Pascucci, Sesto San Giovanni, Italy

[73] Assignee: STMicroelectronics S.r.l., Agrate Brianza, Italy

[21] Appl. No.: 08/865,642

[22] Filed: May 30, 1997

[51] Int. Cl.[7] .................................................. G06F 11/00
[52] U.S. Cl. ............................................................ 714/718
[58] Field of Search ................................... 714/718, 719, 714/721, 723

[56] References Cited

U.S. PATENT DOCUMENTS 5,848,077   12/1998   Kamae et al. ............................. 371/21

*Primary Examiner*—Vincent P. Canney
*Attorney, Agent, or Firm*—Seed and Berry LLP; David V. Carlson

[57] ABSTRACT

The invention relates to a circuit architecture for easily carrying out tests on a non-volatile memory device having at least one matrix (2) of memory cells. The architecture is distinctive in that it comprises a bi-directional internal data bus (3) extending from one end to the other of the memory device, a plurality of signal sources (8) inside said memory device, at least one local bus (6) connected to the data bus (3), and timing means (10) for timing the access of the local bus (6) to the data bus (3) and the selective access of the signal sources (8) to the local bus (6) during the same test cycle.

35 Claims, 27 Drawing Sheets

METHOD AND CIRCUIT ARCHITECTURE FOR TESTING A NON-VOLATILE MEMORY DEVICE

FIELD OF THE INVENTION

This invention relates to a circuit architecture for easily carrying out tests on a non-volatile memory.

More particularly, the invention relates to non-volatile memory architecture which has such structural and functional features s to allow conventional testing operations to be carried out easily, even with a circuit structure of substantial size and complexity.

BACKGROUND ART

As is well known, the ever increasing size and complexity of electronic non-volatile memory devices monolithically integrated on a semiconductor has created a demand for several internal circuit blocks to be rendered fully visible and accessible from the device terminals.

This demand descends from the need to have the data streams, controls and functions suitably set up to facilitate memory surveys, implement analysis features for improved reliability, and reduce the overall size of the memory device.

The demand is also prompted by the fact that the design of certain blocks, their layout or timing, may have to be checked at the initial stages of their fabrication. It can be appreciated that such testing would be facilitated if an ability to view and inspect each internal block can be ensured by a memory device of suitable design.

In this application field, memories are known which are divided into two sub-matrices, hereinafter referred to as the upper (UP) and lower (DOWN) sub-matrices, each) associated with a corresponding row decoder UP_ROW_DEC and DW_ROW DEC.

A column or bit line selector BL is provided on one side of the matrix. On that same side, sequentially connected sense amplifiers SA and output stage buffers OUT are also provided.

In a memory of this type, there are two distinct signal paths between the input/output terminals I/O and the column selector. A first path is dedicated to reading operations from the memory, and the second path is dedicated to the transfer of programmed data within the memory.

Another major feature of this conventional memory architecture is that no normal data transmission path is provided between one side of the memory, such as the side where the address terminals are usually located, for example, and the other side thereof, i.e., the side where the output stages are accommodated.

In this kind of memory, testing is usually allowed by some dedicated circuitry.

The provision of test-dedicated circuitry obviously involves considerable designing effort, takes up circuit area, and increases costs.

In addition, interconnection lines must be provided between circuit nodes which may be far apart. These lines occupy substantial circuit area and require for their activation a complicated dedicated control network of non-modular nature.

In fact, the transmission of data picked up from the memory matrix for reading and sending to the output terminals is effected on dedicated lines; and this applies as well to the transmission of data indicating the memory states and running events. Thus, auxiliary lines must be provided for the testing data which extend through the memory device, according to the locations of the internal and external sources from which data and information are to be picked up.

It should also be considered that certain tests require a monitoring signal, additional to a control signal, which increases the total number of test signals and the complexity of the arrangement.

In this way, in view of the continually increasing amount of information about the memory operation which must be sent out, a large number of extra lines must be added to the memory data transmission lines, thereby increasing the area physically occupied by the memory device and making the device more complicated to exercise.

Furthermore, a testing circuitry designed for a specific circuit architecture cannot be readily adapted for other circuit types or new products, even if partaking much of their design.

Summarized in FIG. 2 are schematical representations of the main timing signals which are typical for a memory architecture of the above type.

These signals can be described as follows.

ATDn—signal which detects a transition on one of the address inputs. This detection would initiate a read cycle.

PC—R a signal which activates all of the devices intended for a precharge function.

EQ—a signal which equalizes the output nodes of the sense amplifiers SA and enables the reading of data from the memory.

LOAD—R a signal for transferring newly read data to those output buffer stages which are normally disconnected from the rest of the internal circuitry.

In this conventional type of architecture, each circuit block has a dedicated line or bus. For example, some signals in FIG. 2 show that only one predetermined line at a time is enabled to transfer output data. This means that the various blocks are not necessarily active at all cycles, and yet much of the circuit area is taken up by the various connection lines and related control circuits.

SUMMARY OF THE INVENTION

In addition, during an ordinary read cycle, the basic data bus will be transferring valid data, from the sense amplifiers to the output buffer stages, only after the precharge and sense period. Before that, the data bus is in an invalid state.

It is an object of this invention to provide a circuit architecture which allows a memory to carry out read and user's program applications and at the same time perform a number of testing functions, so as to eliminate connect on lines and modularize the transfer of data, commands and instructions, and do without dedicated control structures.

An ability to perform a large number of testing operations on several internal blocks of the memory device would afford external control on all the functions of the various blocks and enhance the reliability of the device as a whole.

Another object of this invention is to provide a non-volatile memory architecture, wherein the number of internal blocks which can be inspected directly from outside is increased, thereby providing for improved monitoring.

A further object of the invention is to provide a non-volatile memory which allows the data streams to be standardized and synchronized.

Yet another object is to provide a non-volatile memory architecture which can expand the scope of troubleshooting procedures while facilitating them.

A not least object of the invention is to provide a non-volatile memory device which is highly reliable and relatively easy to make at competitive costs.

In the light of the foregoing, this invention is given a number of objectives which can be summarized as follows:

carrying out the test operations in a compatible way with architectures whose internal setup is of the "time-shared" type, that is, by the use of existing circuitry in the architecture;

making the circuit portions meant for testing an integral part of the memory architecture;

improving the visibility of the internal blocks of the memory;

minimizing the number of interconnection lines required for monitoring the internal blocks;

providing a non-volatile memory architecture wherein the number of data transfer connection lines can be reduced;

avoiding the provision of specific testing circuitry for one particular application;

defining a modular type of operation which can also implemented in different devices;

improving the visibility of redundancy structures;

operating the redundancy structures and their timed portions in an optimum fashion;

allowing non-volatile fuse elements to be configured from outside.

SUMMARY OF THE INVENTION

These and other objects are achieved by a circuit architecture as previously indicated being characterized in that it comprises at least one bi-directional internal data bus extending from one end to the other of the memory device, a plurality of signal sources inside said memory device, at least one local bus connected to the internal data bus, and timing means for timing the access of the local bus to the data bus and the selective access of the signal sources to the local bus during the same test cycle, as well as further redundancy, configuration and instruction buses which are independently accessible through the data bus.

The features and advantages of an architecture according to the invention will be apparent from the following description of an embodiment thereof, given by way of non-limitative example with reference to the accompanying drawings.

DETAILED DESCRIPTION

Figure 3A:
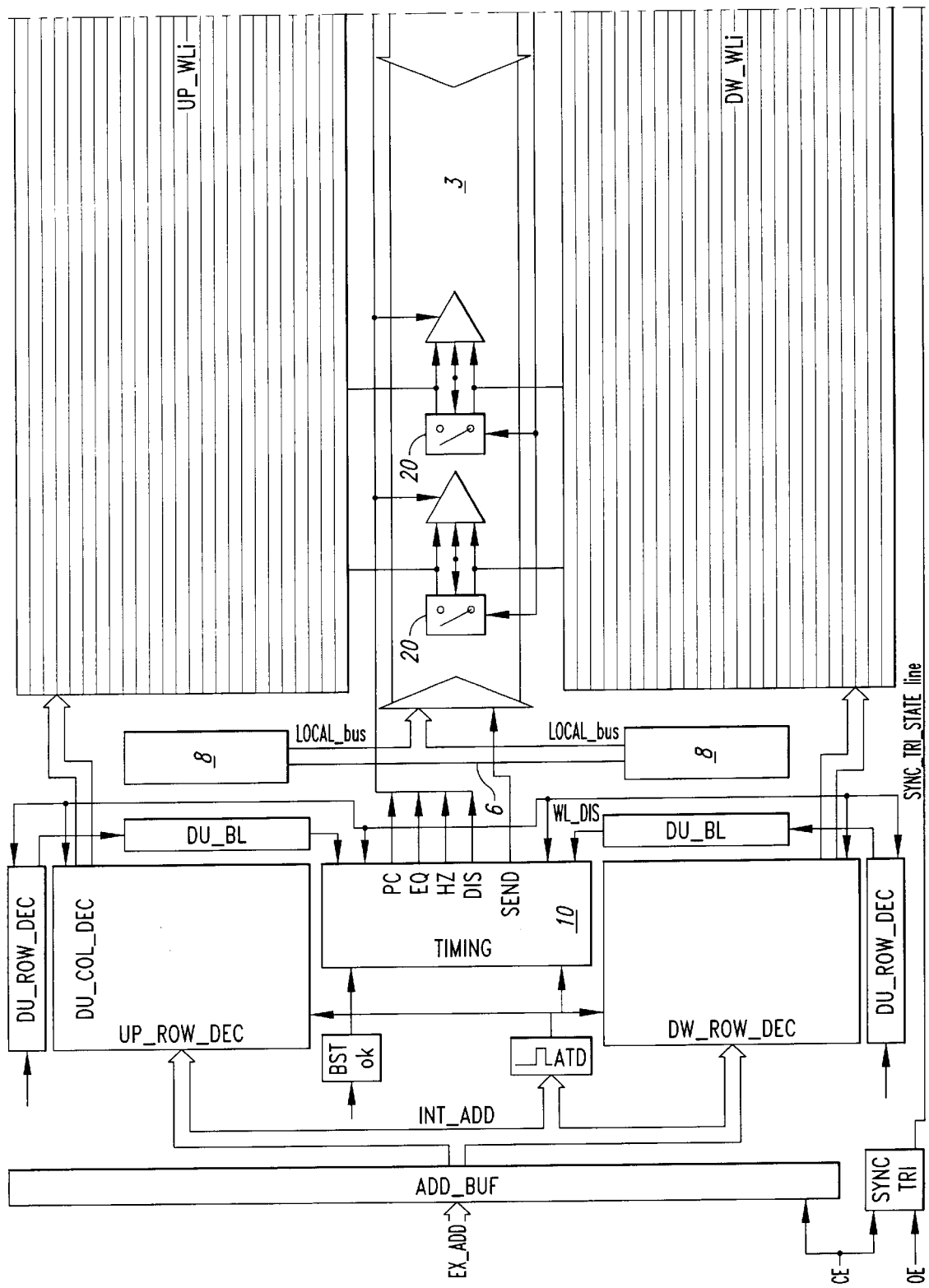
FIG. 3 is a general block diagram of the architecture of the memory device according to the invention.
Figure 3B:
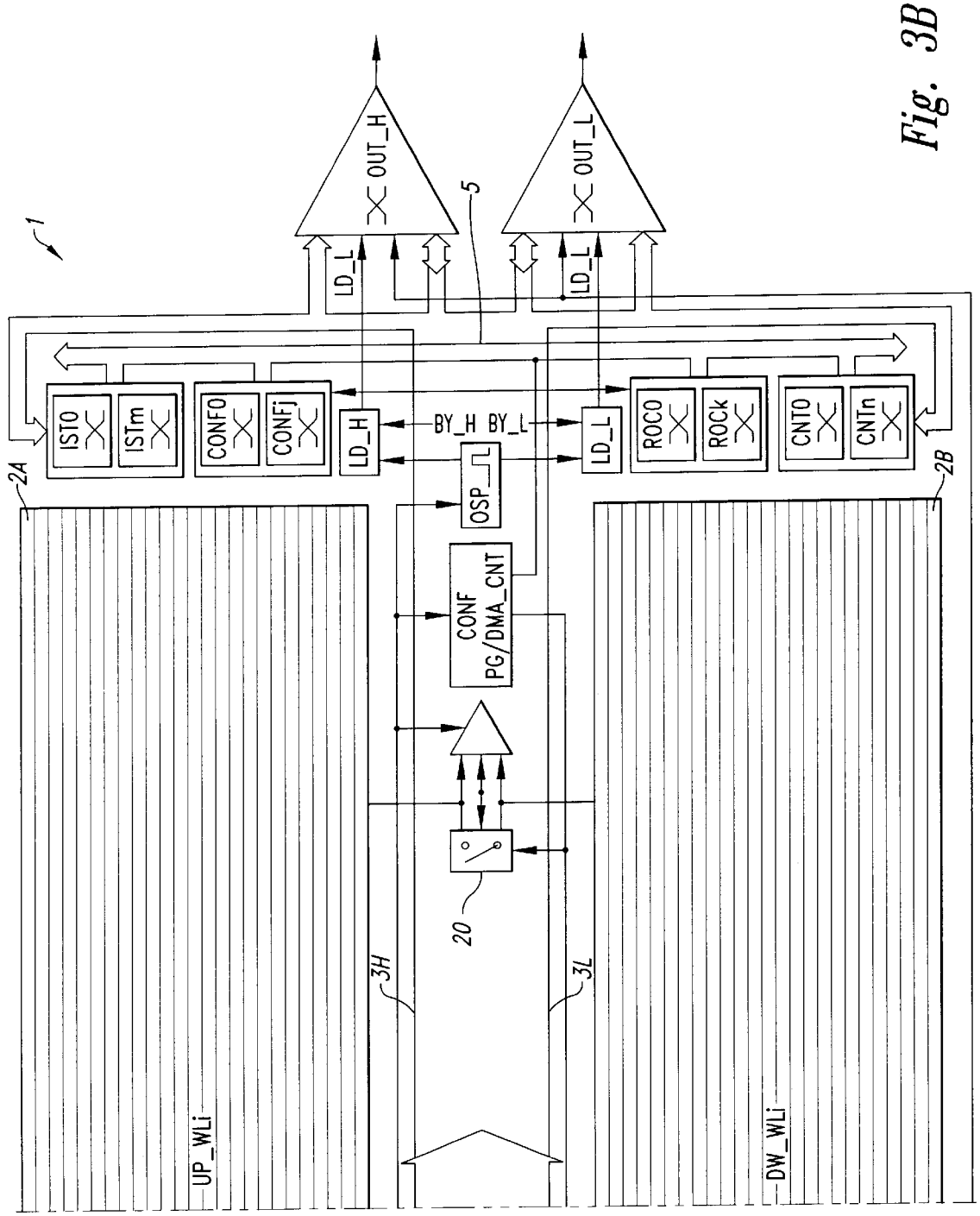

Referring in particular to the example of FIG. 3, generally and schematically shown at 1 is a circuit architecture for easily testing a non-volatile memory. FIG. 3 shows, in better detail than FIG. 1, the memory modules and their locations, as well as the interfaces between such modules and the bus structures which facilitate their inspection.

The architecture 1 is an electronic memory device monolithically integrated on a semiconductor in integrated circuit form.

The architecture 1 of this invention comprises a memory matrix 2 having an internal bus 3 associated therewith which will be referred to hereinafter as the data bus or INT-bus. The memory matrix 2 is split into two sub-matrices 2A and 2B, hereinafter identified as the upper (UP) and lower (DOWN) sub-matrices which are associated each with a corresponding row decoder UP_ROW_DEC and DW_ROW_DEC.

The data bus 3 extends centrally between the sub-matrices 2A and 2B, and interconnects the two opposite ends of the architecture 1 which are connected through to the input/output terminals of the integrated circuit.

The data bus 3 serves all the functions of connecting and transferring data to and from the memory matrix 2. Interfaced therewith are enable and program circuits 20 to be described. It should be noted that a skilled person in the art might mistake the bus 3 for an ordinary internal bus, as is usually provided in memory devices for transferring data out. In this case, however, the internal bus is a unidirectional type and not operational, according to the principle of this invention.

Advantageously, in fact, the data bus 3 is timed to provide a number of functions, among which is the testing function according to this invention.

The invention is concerned, in particular, with exercising the access and transmission protocol on the data bus 3.

The skilled person in the art will at once appreciate that this configuration of the architecture of this invention, having a timed central bus, allows a main data stream route to be provided which can be used by plural system resources to access the central bus independently and in accordance with a timing protocol.

The data bus 3 provides connection between either sides of the memory device; that is, between input/output exercising means (I/O) and local signal sources, as explained hereinafter. In addition, this bus 3 will itself configure, usually during the precharge step, a register containing information about column redundancy, certain test execution commands, and particular system configurations.

This register can also release its contents to the bus 3 so as to allow inspection from outside.

Figure 1A:
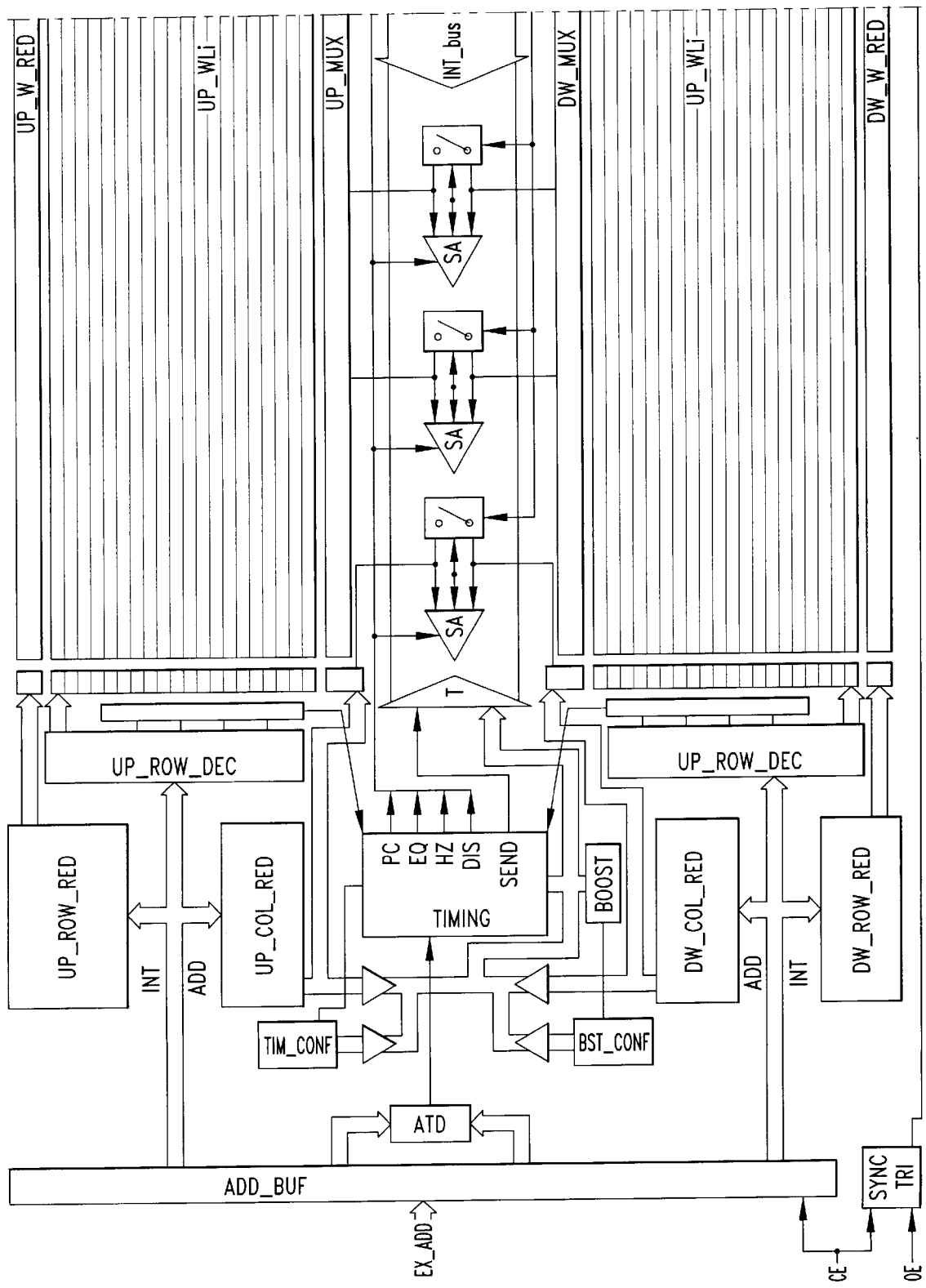
FIG. 1 is a general block diagram illustrating schematically the architecture of the memory device of this invention.
Figure 1B:
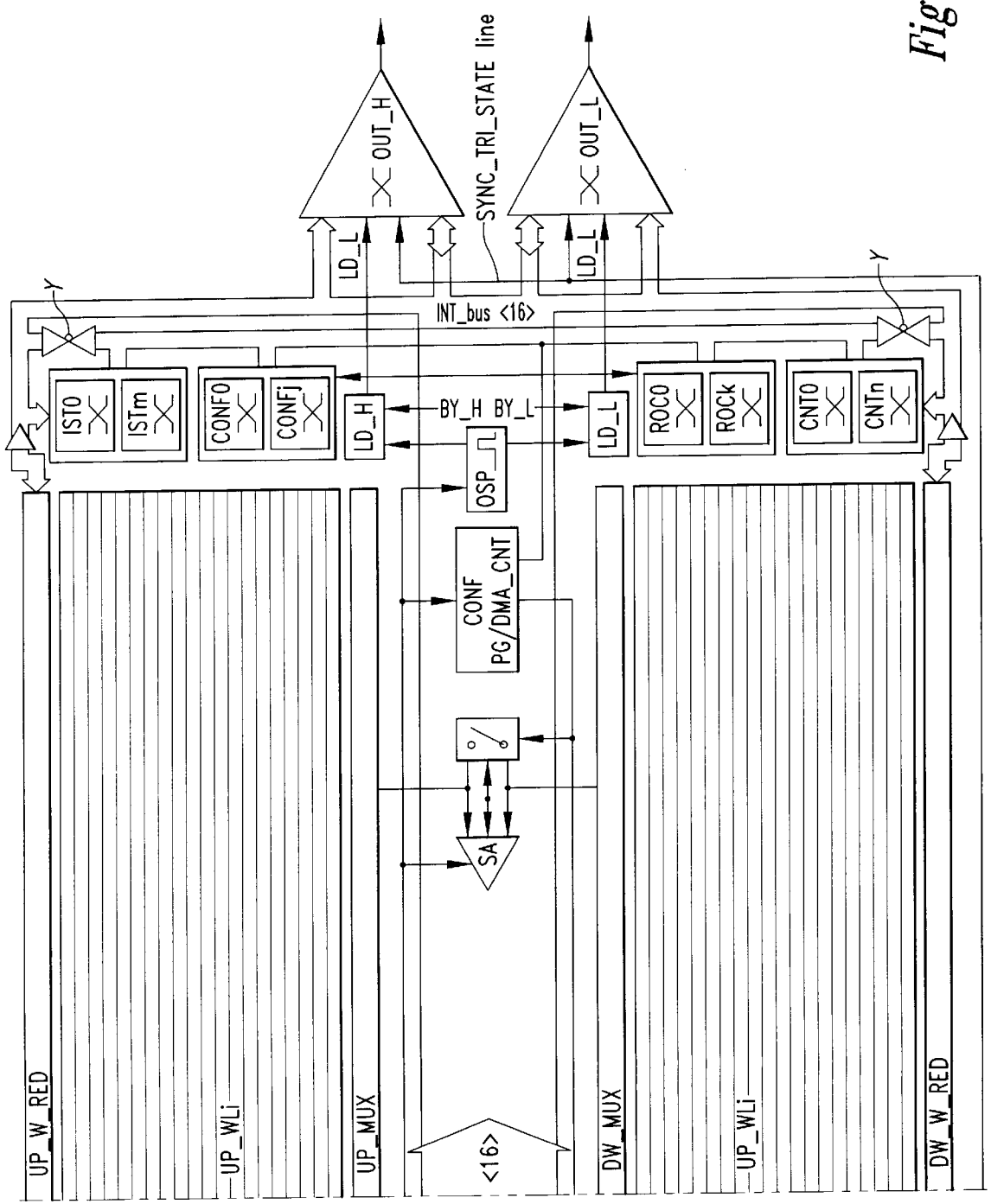
Figure 2:
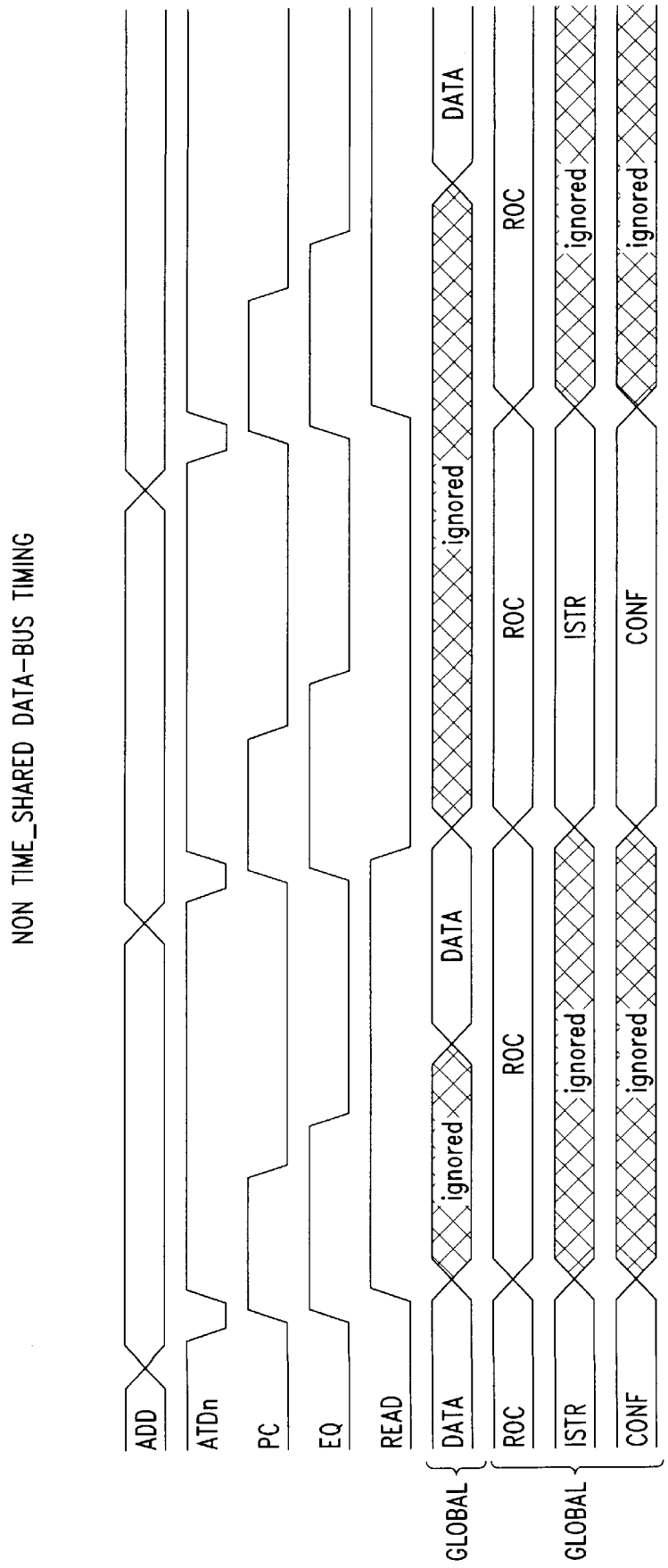
FIG. 2 is a timing diagram of the various signals produced in a conventional type of memory device.

The register in question can be configured from outside, through the bus 3, using multiplexer structures Y as shown in FIG. 1.

Furthermore, the row redundancy lines can also be connected to the bus 3 directly, during a testing step, so as to be visible from outside, either simultaneously or by scanning.

The data bus 3 obviously has characteristics of bi-directional data transmission between the input/output exercising means and the memory matrix 2.

More particularly, the data bus 3 is split into two buses 3L and 3H, the affixes L and H relating to the half-word designated L and the half-word designated H, respectively. The combination of the two buses 3L and 3H are dedicated to transferring data to and from the two memory sub-matrices 2A and 2B, as well as to and from various memory modules during the testing step.

Figure 5A:
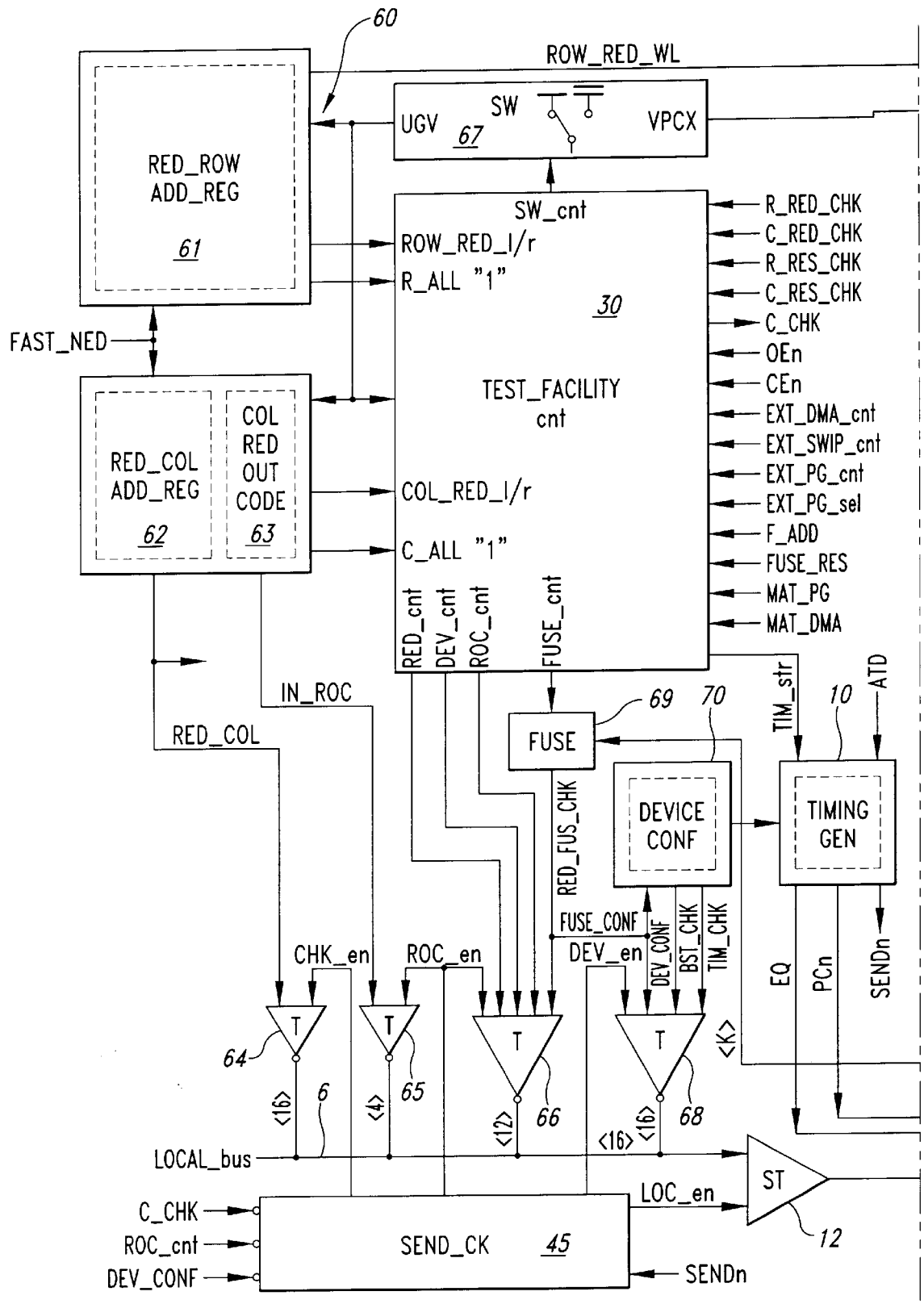
FIG. 5 shows schematically a circuit portion of the architecture in FIG. 3, and highlights the bus connection paths and their interfacing to the circuit portions which are to perform the test operations in accordance with this invention.
Figure 5B:
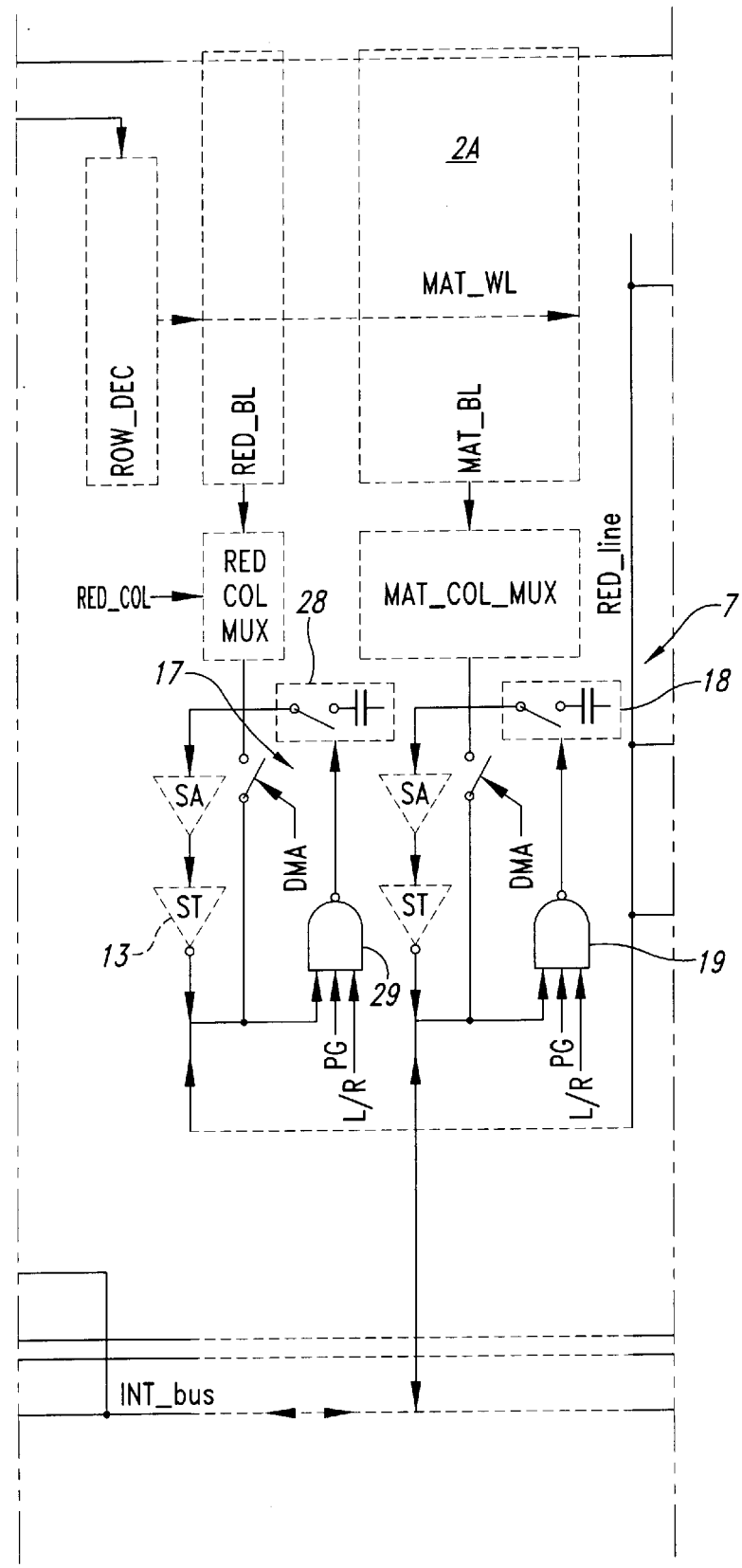
Figure 5C:
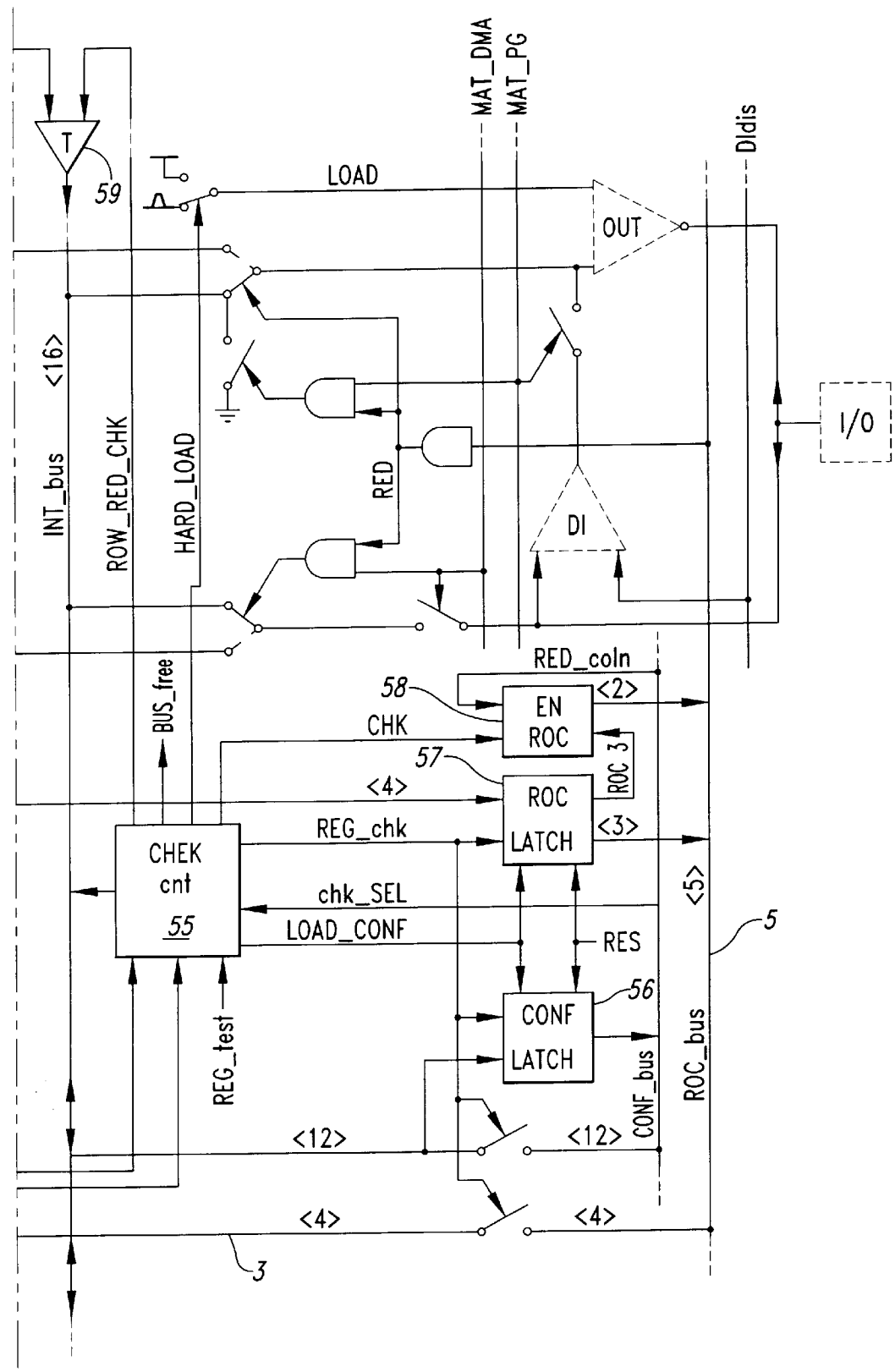

Associated with the data bus 3 is a single additional line RED_line for transmitting redundancy data. In essence, the column redundancy functions are served, as far as the data side is concerned, by one additional line supplementing the central bus, as shown in FIG. 5. As far as the coding of the bit to be repaired is concerned, this function is instead served by a portion of the data bus 3 itself.

Thus, the architecture of this invention requires an additional bus neither for the redundancy nor the test operations.

The data bus 3 is connected to corresponding output buffer stages OUT_L and OUT_H, and connected thereby to output terminals I/O_L and I/O_H.

The output buffers OUT_L and OUT_H include, inter alia, structures of the tri-state type conventionally interfacing with the outer world.

The output terminals I/O_L and I/O_H provide a means of outputting/inputting data to allow data to be output during the memory reading step and data input to the memory during the programming step.

In view of the architecture being symmetrical, reference will be made hereinafter to just the portion of this architecture that carries the "L" affix. All considerations made in the respect of this part of the device will equally apply to its symmetrical counterpart "H".

The output terminals OUT_L and output buffer stages I/O_L actually are eight output terminals and eight output buffers, since the memory device under consideration is of the sixteen-bit type, ie., with words (bytes) of sixteen bits. Accordingly, there are one output buffer and one output terminal for each bit.

Likewise, the data bus 3L includes eight lines, and eight lines are also provided in the data bus 3H.

The data bus 3 branches off, near the output terminals, to a functional bus, denoted by the reference numeral 5 in FIG. 3. This bus 5 connects the memory matrix to the sense amplifiers.

The functional bus 5 communicates, to the data bus 3, certain instruction registers IST0, . . . , ISTm and configuration registers CONF0, . . . , CONFj.

The functional bus 5 is driven from the configuration registers CONF and has sixteen lines available to it. However, a larger or a smaller number of lines could be provided, as required. For example, some lines may be dedicated to handling the configuration code of column redundancy, thereby avoiding the need to provide specific redundancy lines at the designing stage. The bus 5 may, in turn, be post-connected to the data bus 3 through the multiplexer structures Y. This would allow inspection of the registers which control the functional bus 5.

On the opposite side of the architecture, near the row decoders, the data bus 3 is multiplexed by a unidirectional local bus 6, also denoted by the reference LOCAL_bus.

The local bus 6 is a sixteen-line bus and may be set up as distinct groups of buses according to the number of different blocks 8 of local signal sources to be connected to the data bus 3. For example, the redundancy function and boost signals from a booster device BST are led to the local bus 6.

Through the local bus 6, the data bus 3 is interfaced to a plurality of structures to be described. The local bus 6 is communicated to the bi-directional data bus 3 during the precharge step. In addition, the local bus 6 controls and drives the bi-directional data bus 3 in a cyclical manner during the precharge step.

The data bus 3 is also controlled from the reading means SA after the precharge step and at each read cycle. More particularly, timing means 10 are shown in FIG. 3 which are input the ATD (Address Transition Detection) signal detecting variations in the memory address and a boost signal generated by the charge-pump booster device BST needed for the precharge step.

The timing means 10 produce, from the ATD signal and specifically the negated ATD signal ATDn, a signal SEND which enables the data bus 3 to be accessed.

The timing means 10 are also effective to generate other drive signals HZ, PG, EQ, DIS for various switches or logic gates, and these signals will be denoted hereinafter by the same references HZ, PC, EQ, and DIS.

The internal timing of a non-volatile memory usually involves a critical precharge step followed by an evaluation and data transmission step carried out externally. These functions are permitted by the signals PC and EQ enabling the sense amplifiers SA to be respectively programmed and equalized during a reading step.

During the precharge step, the data bus 3 would not be used, as will be explained in describing the operation of the inventive device. This internal bus is brought into operation during the transfer of data, after the evaluation step.

Thus, the data bus 3 is available for use by other system resources during the precharge step.

The (high impedance) signal HZ enables operation of the sense amplifiers SA. HZ is normally at a high logic value because in most cases other resources would be controlling the data bus 3, and the sense amplifiers are only enabled at the end of the reading step. Accordingly, when HZ is at a logic 1, the sense amplifier is not authorized to reading; conversely, when HZ=0, the sense amplifier SA is enabled.

The architecture 1 comprises a plurality of local signal source blocks 8; the construction and operation of such blocks 8 will be described hereinafter. Each source block 8 is selected and synchronized to a signal derived from the main read synchronization signal ATD.

Figure 4A:
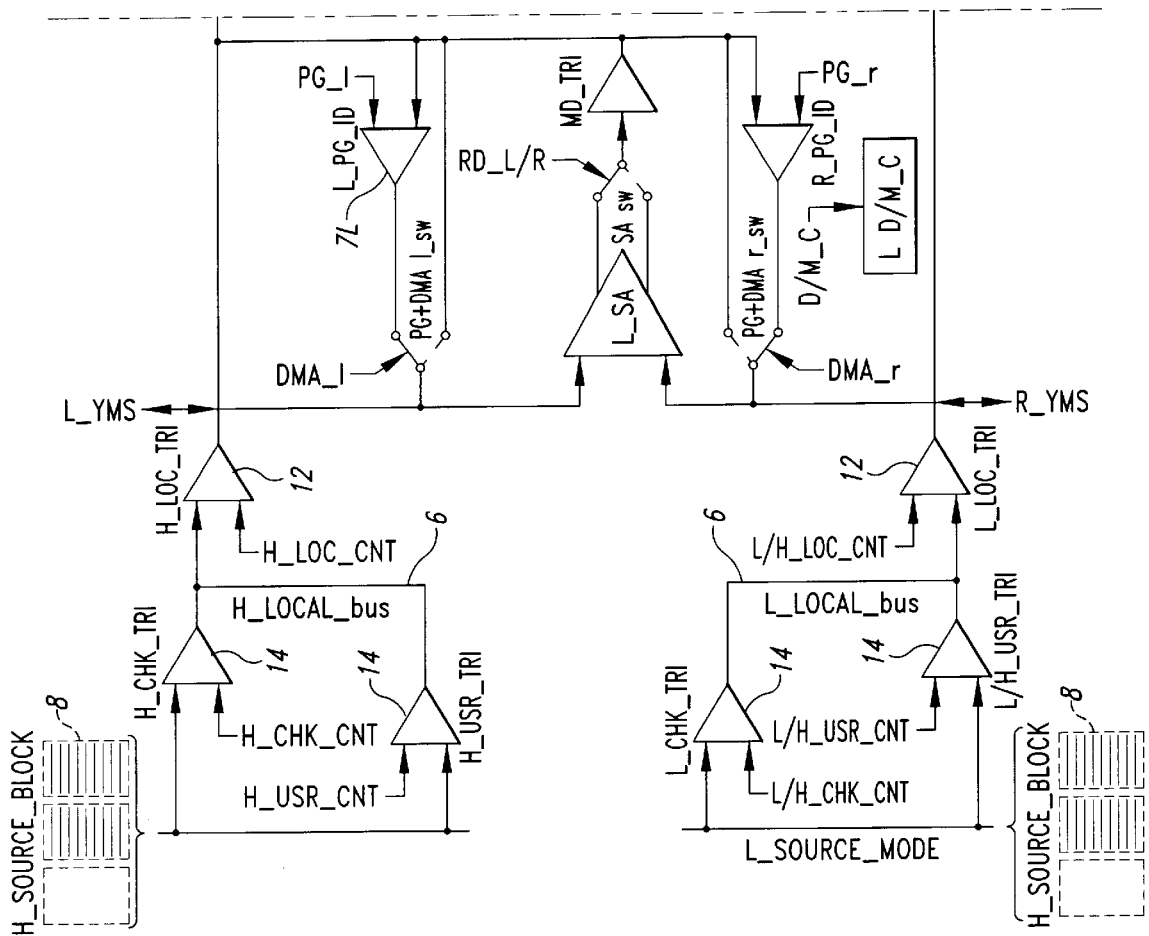
FIG. 4 is a block diagram of the architecture of the main connections between circuit portions of the memory device shown in FIG. 3.
Figure 4B:
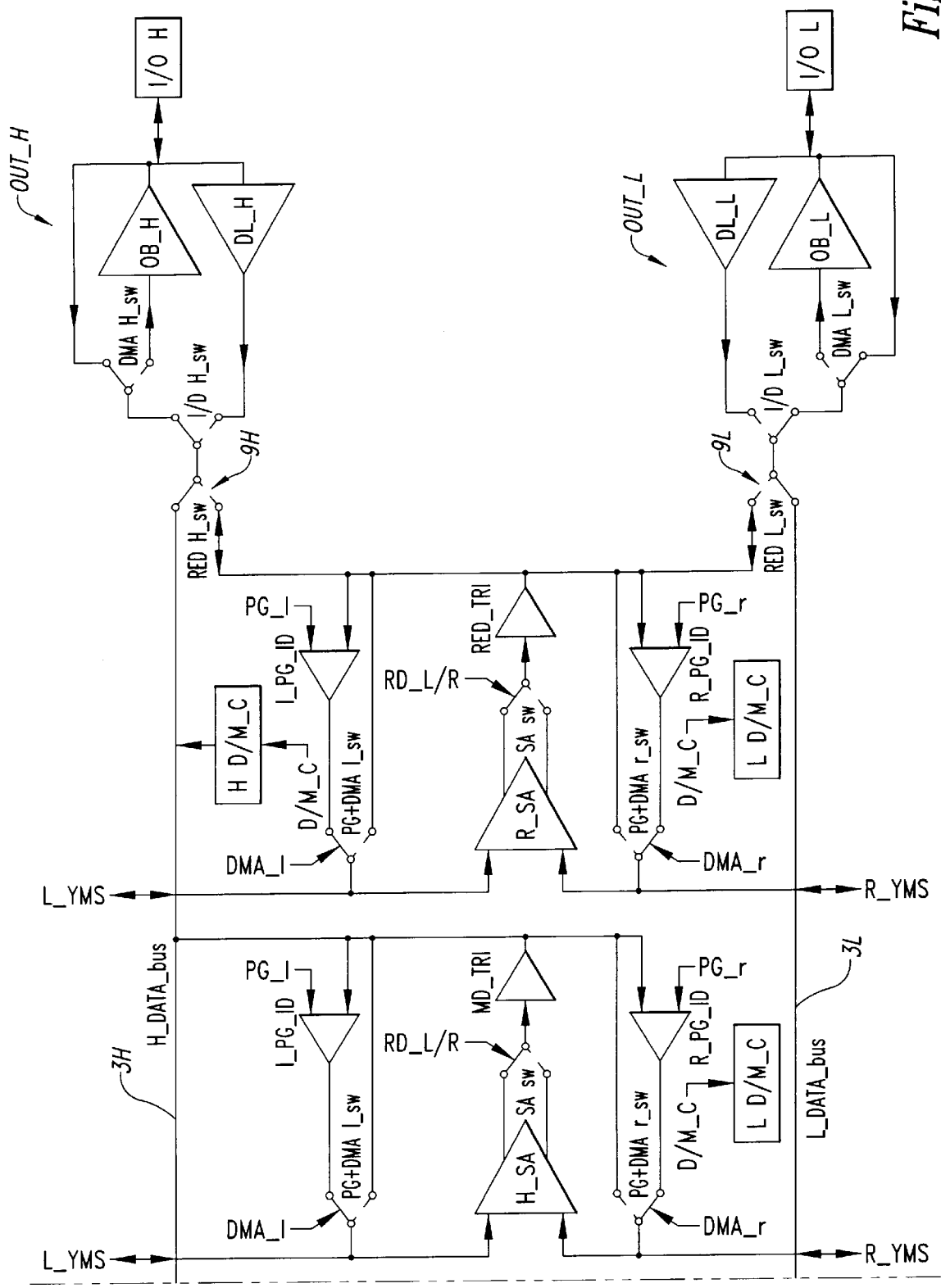

Shown schematically in FIG. 4 are the main internal connections of the architecture 1, i.e., of the main structures and the bus connection network therebetween.

The connection of the local source blocks 8 and respective local bus 6 to the data bus 3 is effected by closing logical switches 12 of the tri-state type.

Shown in the same Figure at L_SA, H_SA and R_SA, respectively, are the sense amplifiers which are associated with the portions 2B (L-affixed) and 2A (H-affixed) of the matrix 2, as well as with the redundancy portion (R-affixed).

The connection paths between the data bus 3, the output buffer stages and the output terminals are as described herein below.

A direct connection path is provided between the internal bus 3L and the output terminal I/O_L. and is exercised by enable/disable means. These means are represented to advantage by switches I/O_L_SW as shown in FIG. 4.

The direct connection path between the data bus 3 and the output buffer OUT_L is also exercised by enable/disable means implemented as switches 9H and 9L. For example, the switch 9L enables the connection path between the data bus 3L and the output buffer OUT_L, to read data from the memory or for data directed from the outside world (PG) to the memory, a possible change in path being contemplated for both streams in case of redundancy.

During the reading step, the switch 9 will change the data path toward the output to be repaired, such that it originates from the redundancy sense amplifier SA rather than the natural sense amplifier (which is being replaced).

Likewise, during the programming step, data to be programmed in a redundant column is diverted from the natural matrix line and stored on the redundancy line.

Also, a connection path between the data bus 3 and the memory matrix 2, as used for carrying out DMA (Direct Memory Access) tests, is established by closing a switch denoted by DMA.

Program enable means 7 are also provided, as denoted by the references 7L and 7H, in association with respective sides of the matrix, which means 7 are operative to program the memory 2, and therefore to allow data to be sent over the data bus 3L in the opposite direction to that of the normal stream provided for reading. The programming means 7L, 7H actually include eight program enable means, similar as the output buffers OUT_L and the output terminals I/O_L.

The program enable means 7L comprise structures of the bi-directional type, such as pairs of CMOS pass transistors.

The output from the programming means 7L is data to be programmed into the memory which is sent to the connection path leading to the data bus 3L through means for enabling/disabling outside access to the data bus, and hence to the memory. Advantageously, such means may include a simple switch being input a program signal carried on the line PC.

The output buffer OUT_L is input an enable signal carried on a line denoted by LOAD_L. In a like manner, the output buffer OUT_H is input an enable signal carried on a line LOAD_H.

A direct memory access signal, carried on a line DMA, drives a switch and redundancy structures to be described.

A signal disabling the programming means 7L, carried on a line Dldis, is input to said programming means. Means of exercising column redundancy will be discussed later in this description.

There may also be provided further means 22 of enabling/disabling the exercise of the x16 or x8 parallelism which will be described in greater detail in relation to FIG. 6.

With reference in particular to the example of FIG. 5, the structure of the circuit portion for testing the memory matrix will now be described in detail.

In that Figure, the memory sub-matrix 2A is denoted schematically by a ghost outline which encloses a smaller area than that shown in FIG. 3, purely for reasons of space limitations.

Associated with the sub-matrix are the corresponding row decoder ROW_DEC and some redundant columns RED_BL arranged to replace any faulty columns in a manner well known in the art.

Connected to the sub-matrix 2A and the redundant columns ROW_DEC are respective selectors MAT_COL_MUX and RED_COL_MUX for carrying out the reading and controlling the access to the redundant columns, respectively.

Such selectors are further connected to respective sense amplifiers SA.

Each amplifier SA has a read-enable tri-state ST associated therewith which is effective to drive particularly capacitive lines.

The amplifier SA connected to the sub-matrix 2A can access the data bus 3, whereas the amplifier SA connected to the redundant columns can only access the redundancy line RED_line which runs parallel to the data bus.

As previously mentioned, programming means 7 are provided which are defined by a branch-off of the bus 3 and reach, through a logic NAND gate 19, a switch 18 enabling the connection to the matrix.

The logic NAND gate is input, additionally to the data bus 3 (and, therefore, the signals from the input/output exercising means I/O), the program signal PC generated by the timing means 10 and a further signal, designated LIR, which transmits information concerning that portion of the memory sub-matrix 2A or 2B which is affected by the programming.

A switch controlled by a DMA signal is connected between the branch-off from the data bus, going to the input of the logic gate 19, and the selector MAT_COL_MUX.

The amplifier SA, tri-state ST, switch 18 and logic gate 19 represent control structures for accessing the matrix or a section thereof The signal PC forces the programming step, while the DMA signal enables direct access to a memory cell during a testing step.

Programming means 17 are also provided for the redundancy side, which means are defined by a branch-off of the line RED_line and reach, through a logic NAND gate 29, a switch 28 enabling the connection to the matrix.

A similar switch controlled by the DMA signal is connected between the redundancy line branch-off to the input of the logic gate 29 and the selector RED_COL_MUX.

Figure 6:
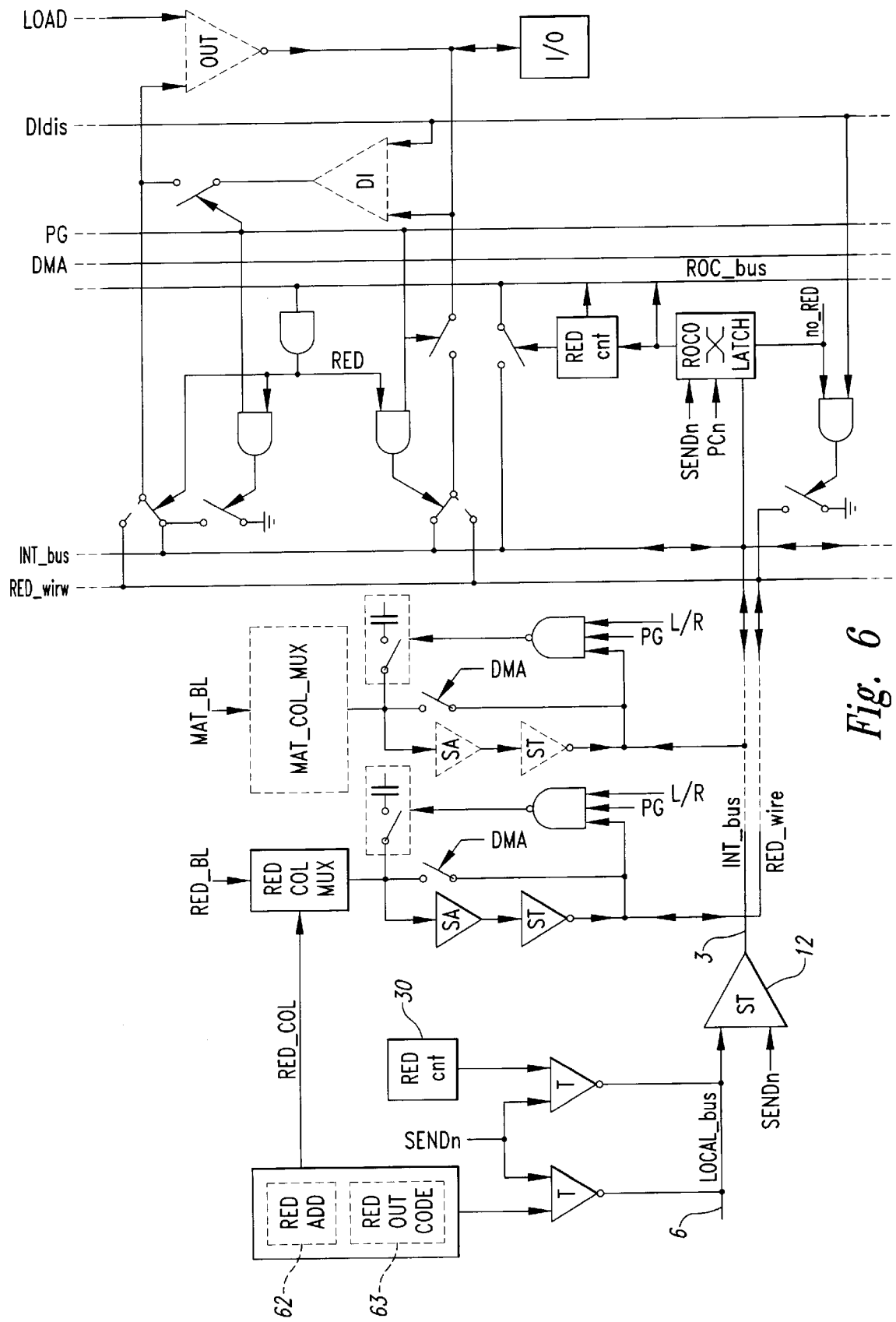
FIG. 6 is an enlarged-scale view showing schematically a detail of a circuit portion of FIG. 5 arranged for exercising column redundancy.
Figure 11:
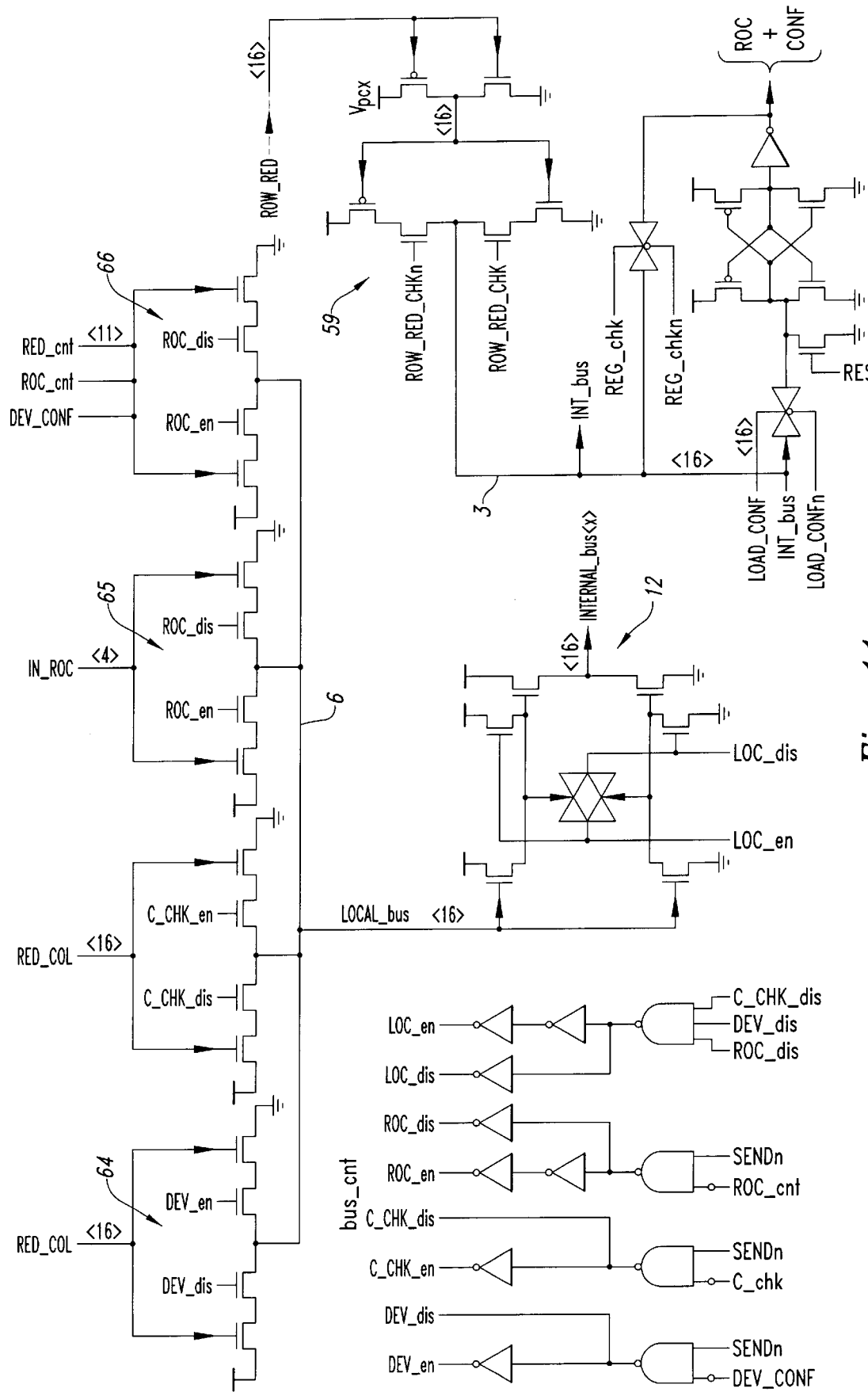
FIG. 11 illustrates the bus control structures and how some of the main control signals used in the architecture of this invention are generated.

The structures controlling the access to the matrix are shown in FIGS. 6 and 11 in greater detail.

Also shown in FIG. 5 are the structures arranged to perform the redundancy function.

It should be noted that the redundancy functions would normally be implemented in the following modes:

block mode—in the presence of an error in a memory word (i.e., at least one faulty bit), the whole word, i.e., all the rows and columns affected, is replaced; this results in a substantial consumption of circuit area for the redundancy feature;

output mode—the output that contains the faulty line is found out, and only the line that connects the faulty line output is connected; however, a dedicated bus is needed to carry over the code of the redundancy output.

By contrast, in this invention, the redundancy circuitry is also controlled through the data bus 3.

In co-operation with the output stage, a circuit portion 60 exercises all of the row redundancy functions, namely the reading and programming of the redundant row lines rather than the matrix lines.

The portion 60 includes a redundant row address register 61 from which a redundant word line, denoted by the reference ROW_RED_WL, goes out and through the cell matrix 2A to the data bus 3 via a tri-state 59 whose structure is detailed in FIG. 11.

A redundant column address register 62 is connected to the register 61 by a connection FAST_NED which allows a redundant address to be quickly situated with just a few read "taps", without accessing all of the redundant addresses.

The register 62 transfers its data onto the data bus 3 through the local bus 6. This is a typical example of the way the inventive architecture operates. The local bus 6 allows certain operations to be performed locally, and the data bus 3 is only accessed for transferring the final data between the input and output sections.

Advantageously, the internal resources relating to row redundancy can be viewed and inspected from outside by means of said data bus 3. Likewise, the internal resources relating to column redundancy can be viewed and inspected from outside by means of said data bus 3. For example, the logic value of 1 would be an indication of a given resource being utilized for redundancy, whereas the logic value of 0 would indicate that such a resource is not utilized for redundancy.

More particularly, outgoing from the register 62 is a sixteen-bit bus connection RED_COL which accesses the local bus 6 via a tri-state 64 receiving an enable signal CHK_en on its input.

This signal CHK_en is timed by a timing block 45 which is input the signal SENDn derived from the ATD pulse through the means 10, and timing signals DEV_CONF, ROC_cnt and C_CHK. The block 45 produces a signal LOC_en which, when applied to the tri-state 12, will enable connection of the local bus 6 to the data bus 3.

The local bus 6 is also accessed by a further register 63 containing the redundant column output codes.

A further tri-state 65 receives a four-bit bus IN_ROC outgoing from the register 63, and communicates this bus to the local bus 6 upon the occurrence of a signal ROC_en from the timing block 45.

The signal ROC_en is also applied to the input of another tri-state 66 which receives various control signals, RED_cnt, DEV_cnt, ROC_cnt and RED_FUS_CHK, from a control unit 30.

The output from the tri-state 66 is a twelve-bit bus which accesses the local bus 6.

The control unit 30 is in charge of multiple test operations according to the principles of this invention.

The unit 30 is basically a logic network for effectively routing various control and test signals.

Figure 12:
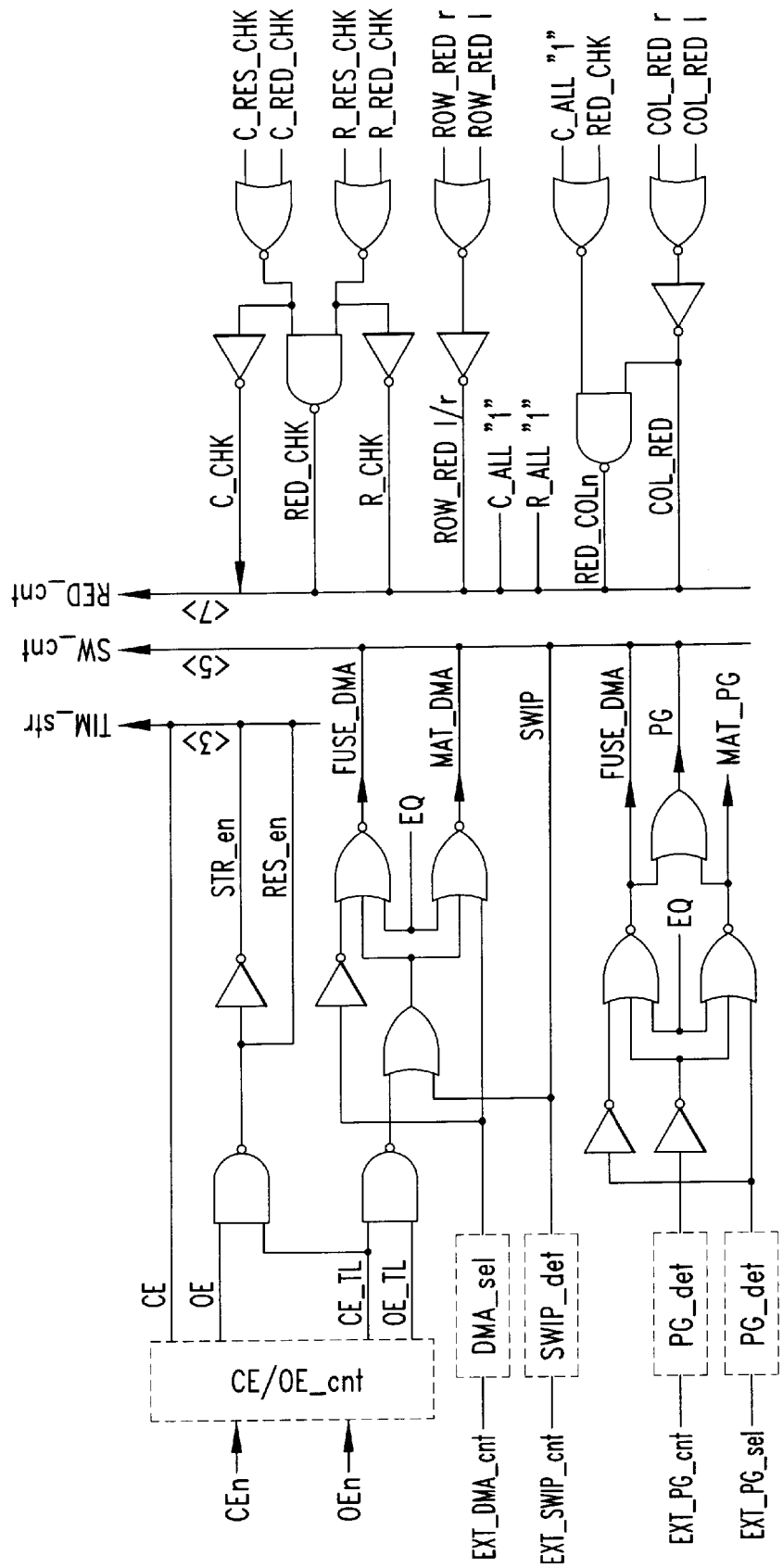
FIGS. 12, 13A and 13B are respective views showing schematically internal circuit portions of the inventive architecture arranged to generate the various control and test signals.

Shown schematically in FIG. 12, is a detail view of the internal construction of the unit 30, where the various logic gates are visible which allow the output signals to be obtained against a plurality of input test signals. Preferably, the unit 30 will be checking the circuit portions and the input signals to the memory matrix.

A second control unit 55, to be described, is preferably arranged to check the circuit portions and output signals from the memory matrix.

Figure 13A:
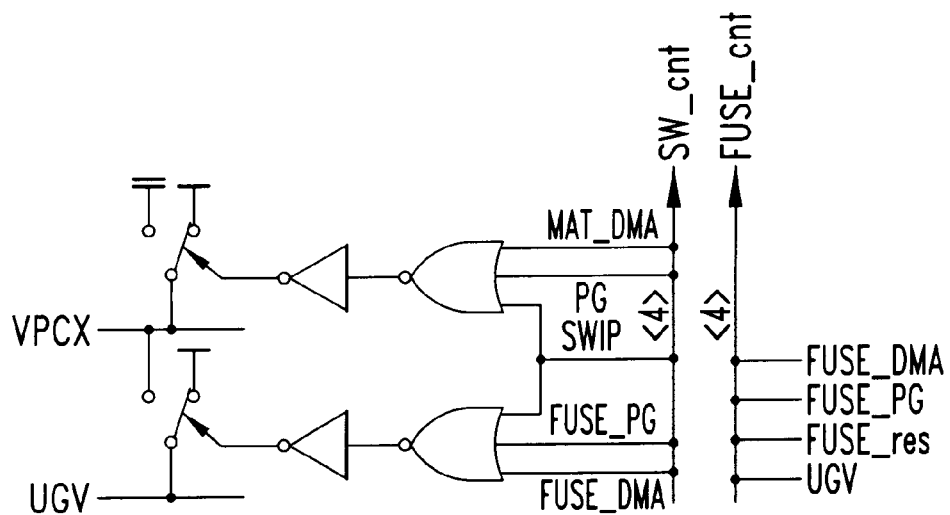
Figure 13B:
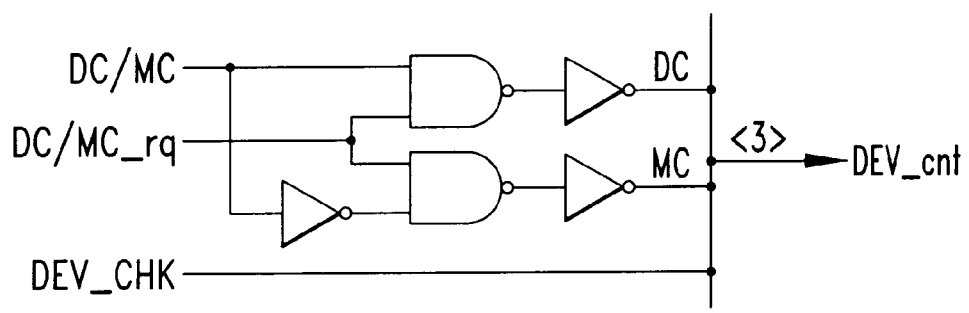
Figure 14:
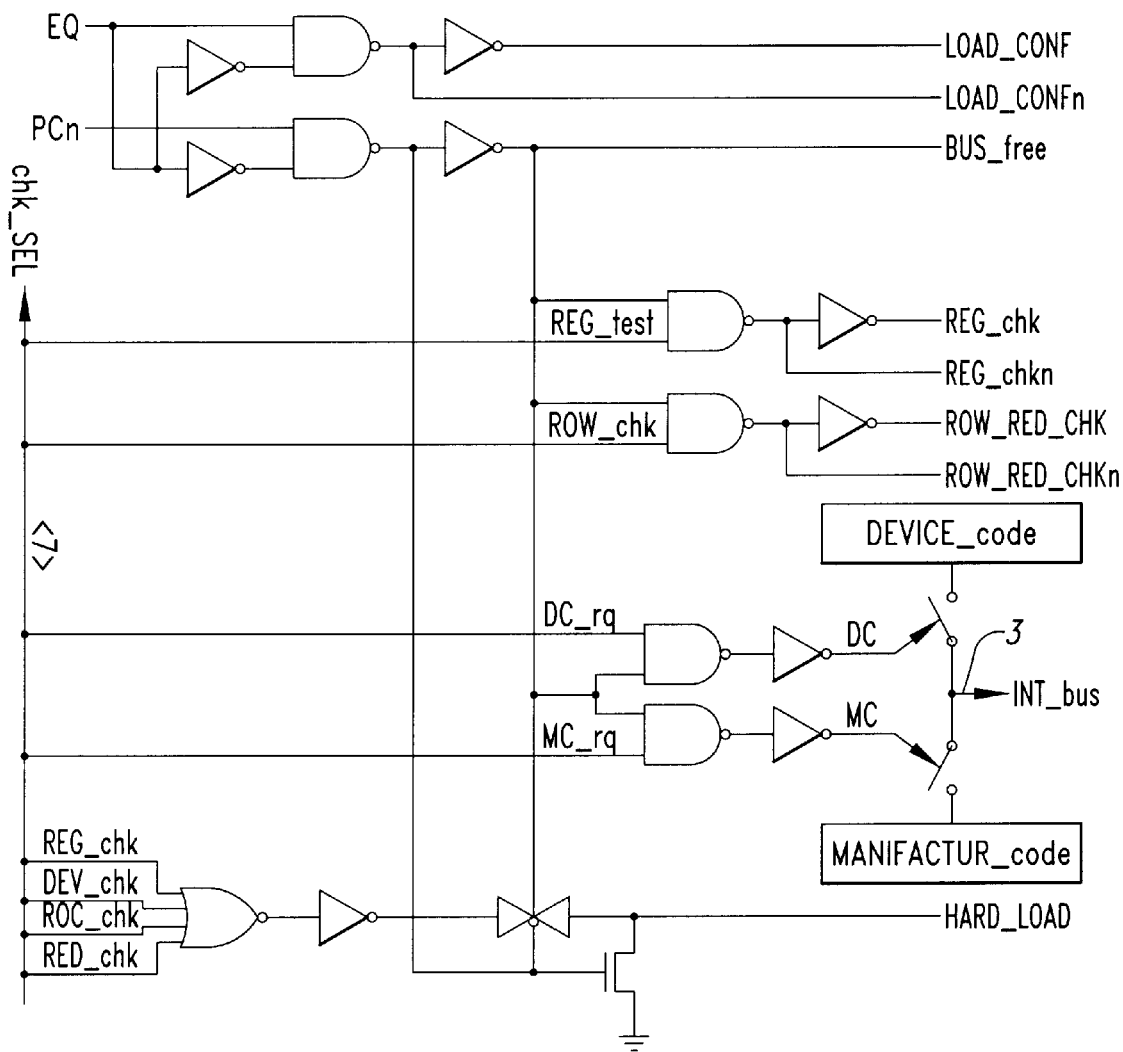
FIGS. 14, 14A, 14B and 14C are respective views showing schematically internal circuit portions of the inventive architecture arranged to generate the various selection, transfer, check and control signals.
Figure 14A:
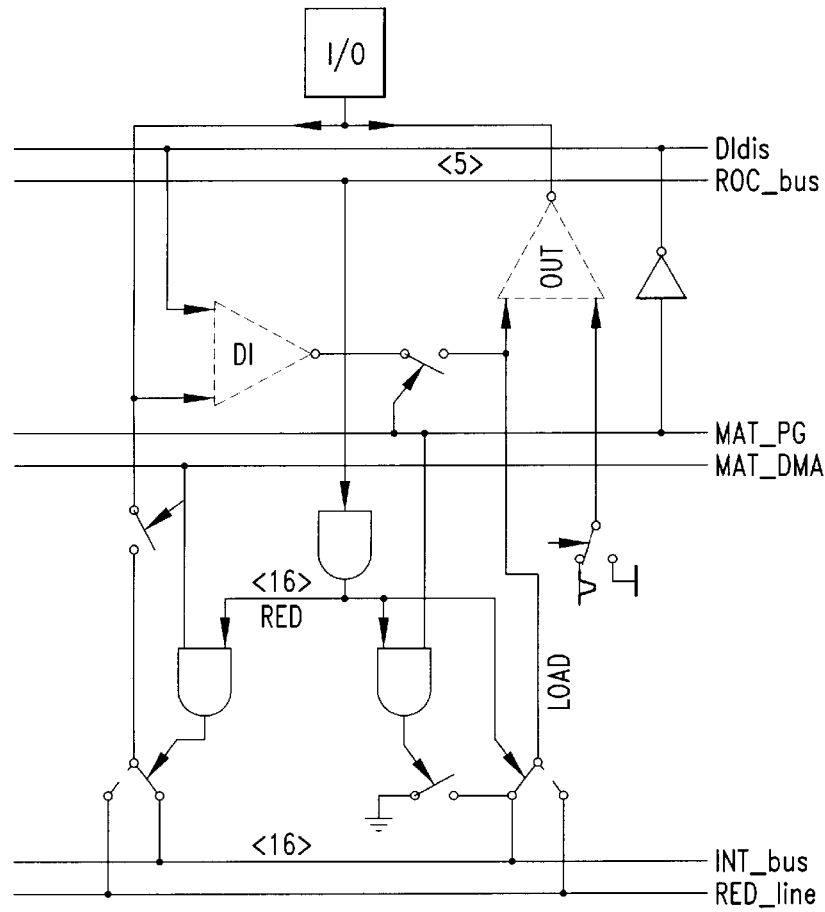
Figure 14B:
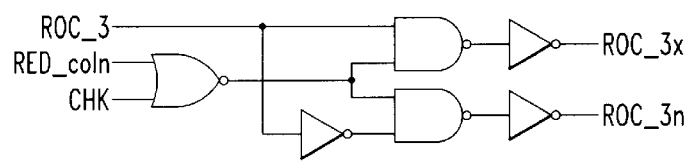
Figure 14C:
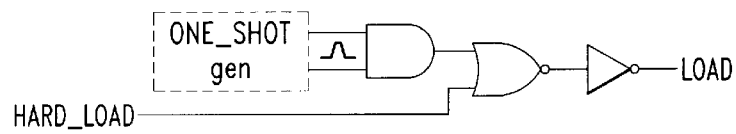

To perform its duty, the unit 30 is connected bi-directionally to the registers 61, 62 and 63, and to a voltage generating and switching block 67 which is driven by the signals shown in FIG. 13A.

Figure 15:
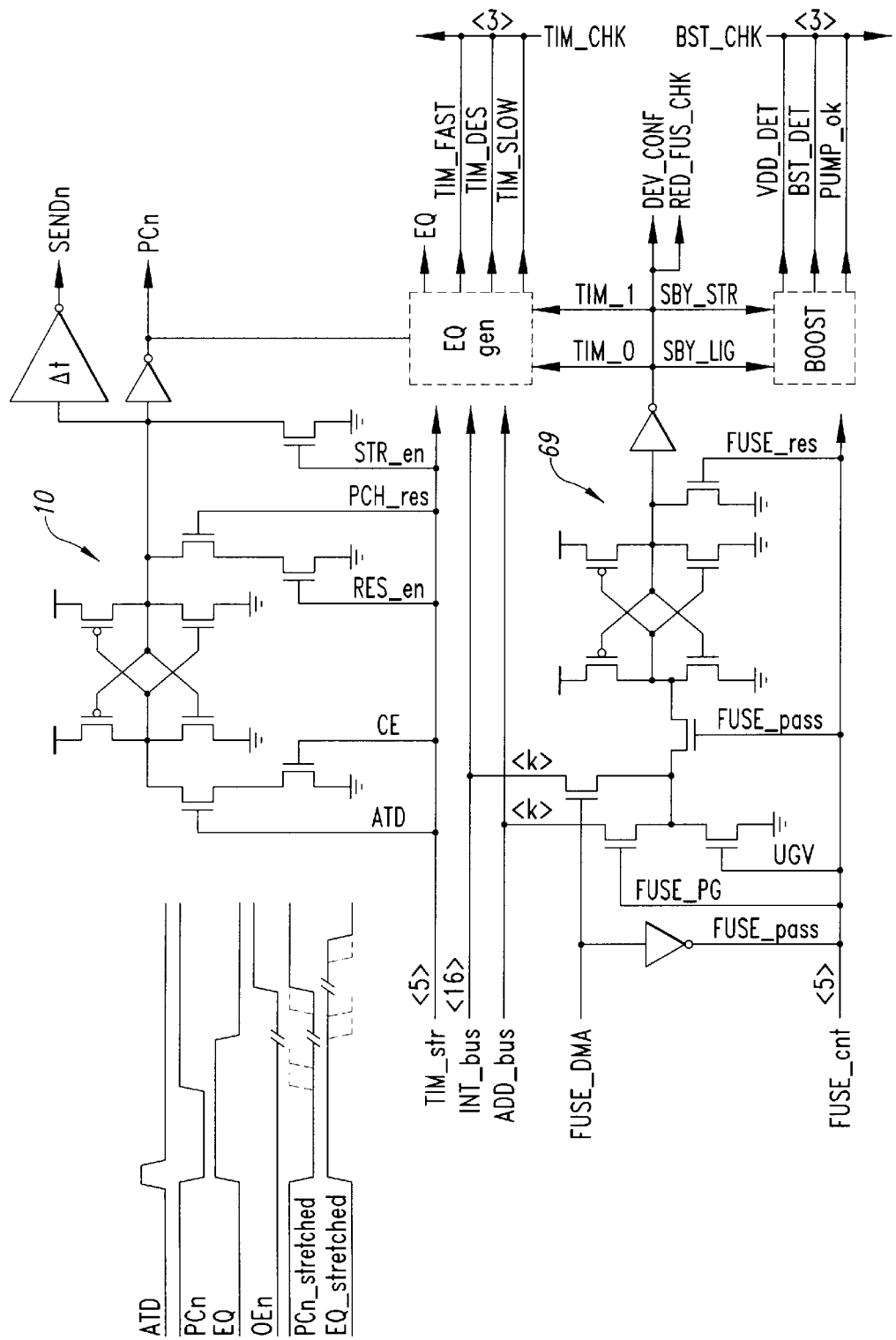
FIG. 15 is a schematic view of internal bus line structures and setups for some special test modes.

The control unit 30 is further connected to the timing means 10 and to a FUSE block 69 which represents a circuit portion including the configuration fuses and having the construction shown in FIG. 15.

Also shown in FIG. 15 is part of the structure of the timing means 10.

The block 69 receives, from the unit 30, a set of signals on a five-bit bus FUSE_cnt, and is in communication with a configuration block 70 of the device.

The signal RED_FUS_CHK applied to the tri-state 66 is derived from the connection between the blocks 69 and 70, and the outputs of the block 70 are connected to the local bus 6 via a tri-state 68 which is enabled by a signal DEV_en from the timing block 45.

The registers 61, 62 and 63, unit 30, and blocks 69 and 70 may be regarded as respective local signal sources 8.

The tri-states 64, 65, 66 and 68 enable communication between the local sources 8 and the data bus. These tri-states carry different enable priorities; specifically, the tri-states 65 and 66 are enabled by the signal ROC_en during a first step of the test cycle.

On the other hand, the other tri-states are enabled during a second step and on request only.

The description will now be completed with a discussion of that portion of the inventive architecture 1 which is associated with the second control unit 55.

This unit 55 receives signals not only from the output section, but also from latch registers and buffer stages located near the output section and arranged to control input circuit portions by means of the connection provided by the data bus 3, which data bus is passing, as previously mentioned, the control signals as well as the data.

The control unit 55 receives the signals EQ and PCn from the timing means 10. The unit 55 is also connected to the data bus 3.

A configuration latch 56 receives on its input control signals from the data bus 3, and outputs architecture configuration signals which are supplied on a twelve-bit bus CONF_bus. This bus is included in the functional bus 5 previously discussed in relation to FIG. 3. The latch 56 may be bypassed by controlling a switch to close which locates in a direct connection between the data bus 3 and the configuration bus CONF_bus.

The control unit 55 receives a signal chk_SEL from the bus CONF_bus. This signal is used to control the transfer of control signals; for example, it allows the catching of data to be checked for possible malfunction.

A latch register 57 is in bi-directional communication with the latch 56 and receives on its input a four-bit bus branching off the data bus 3.

This register 57 outputs to a bus ROC_bus included in the functional bus 5 and specifically arranged to catch, during the precharge step, and execute, during the evaluation step, a re-scan command as well as to transfer the column redundancy.

The bus ROC_bus is enabled from an enable block 58 upon delivery of a signal CHK from the unit 55, a signal ROC_3 from the register 57, and a signal RED_col from the bus CONF_bus.

The caught data is carried on ROC_bus, and the transferred data is carried on CONF_bus; in this way, it becomes possible to find which of the circuit portions or the registers is malfunctioning.

To summarize the above-described functions:

READ—indicates a normal read cycle with respect to such other cycles as programming, manufacturer's code or byte, and testing activities;

DATA—represents the aggregate of the lines which carry data to and from the memory;

ROC (Redundancy Output Code)—represents the aggregate of the lines dedicated to transfer of the code of an output to be redundancy treated, from where the addresses are aligned to where the output is effected;

IST (Instruction Lines)—represents the aggregate of the lines which, like the lines ROC, carry control information or instructions to be executed, from one side to the other of the architecture;

CONF (Configuration)—represents the aggregate of those lines which permit a different configuration of parts of the memory, such as the redundancy configuration, or a shift of data sources from the memory to registers.

The registers CONF, RED, IST can be updated simultaneously during the precharge step, and control respective independent buses CONF_bus, ROC_bus, IST_bus during the next operational cycle to the precharge step.

Referring in particular to the example of FIG. 6, the construction and setup of the column redundancy and that of the sense amplifiers SA and program load will now be described.

The Figure clearly shows the interconnections between such components and the data bus 3.

The circuit portion which exercises the column redundancy at the output buffer stage will also be discussed.

FIG. 6 shows the redundant column programming means in greater detail circuit-wise, with the redundant columns being fully depicted therein as columns associated with the left sub-matrix 2A, LEFT_RED_BL, and columns associated with the right sub-matrix 2B, RIGHT_RED_BL.

The sense amplifier SA is connected downstream of the redundant column and has an output SA)_OUT connected to enable/disable means generally denoted by the numeral 13 and constructed as a tri-state circuit.

This tri-state circuit 13 is particularly well adapted to drive strongly capacitive lines, and is input the signal HZ for enabling/disabling the read path between the sense amplifier SA and the redundancy bus RED_line.

FIG. 6 also shows the circuitry arranged to exercise column redundancy near the output buffers.

A switch 22 exercising the x8 or x16 parallelism comprises two pairs of CMOS pass transistors 23 and 24, each pair including a transistor of the P-type and a transistor of the N-type. The gate terminal of the P-type transistor in the pair of pass transistors 23 and the gate terminal of the N-type transistor in the pair of pass transistors 24 are supplied a suitable redundancy signal RED from output of a logic NAND gate denoted by 27.

On the other hand, the gate terminals of the N-type transistor in the pair of pass transistors 23 and of the P-type transistor in the pair of pass transistors 24 are supplied the same negated redundancy signal REDn through the inverter 25.

The inputs to the NAND gate 27 issue from the internal bus ROC_bus included in the set of connections that form the functional bus 5.

The redundancy signal RED functions to divert the data path in case of a redundancy either during the programming step or the reading step.

The pairs of pass transistors 23 and 24 are then connected to the output buffer stage OUT_L.

A circuit, denoted by 21, includes a pair of N-type transistors connected in series toward ground. The gate terminal of one of these transistors is supplied the program signal PG. This signal functions to force the bus 3L to zero in case of a redundancy while programming.

The gate terminal of a first transistor in said pair is connected to the gate terminals of the pairs of pass transistors 23 and 24 included in the switch 22.

A switch 31L is arranged to enable the closing of a program path to the data bus 3L (or redundancy line RED_ line), and comprises a pair of pass transistors including an N-type transistor and a P-type transistor.

The program signal PG is supplied to the gate terminal the N-type transistor, whereas the negated program signal PGn is supplied to the gate terminal of the P-type transistor in the pair of pass transistors.

The programming means 7L comprise at least one logic gate 32 whose output is supplied, optionally through a cascade of inverters, either to the redundancy line RED_line or the data bus 3L, depending on conditions.

The inputs to the logic gate 32 are a disable signal Dldis for disabling the programming means and the signal from the input/output terminal I/O_L carrying the data to be programmed.

Also provided is a circuit 16 which comprises two transistors of the N-type, 34 and 35. The transistor 34 has its drain terminal connected to the redundancy line RED_line and its source terminal connected to the drain terminal of the transistor 35. The source terminal of the transistor 35 is connected to ground. This circuit 16 is provided to force the redundancy line to ground when there is no redundancy and the programming step is being carried out.

The gate terminal of the transistor 34 is supplied the program signal PG, and the gate terminal of the transistor 35 is supplied the signal enROCn of absence of redundancy.

Redundant column exercising means are generally represented by a circuit portion 50L.

This portion 50L comprises two transistors 36 and 37 of the N-type which are arranged to enable the direct access path to the memory, or to enable the direct access path to the redundancy line RED_line where the data to be read happens to be a redundancy treated data.

The circuit 50L further comprises two pairs of pass transistors 38 and 39, with each pair formed of an N-type and a P-type transistor.

The gate terminals of the two P-type transistors in the pairs of pass transistors 38 and 39 are supplied the negated DMA signal (DMAn) of direct access to the memory. The gate terminals of the two N-type transistors in the pairs of pass transistors 38 and 39 are instead supplied the DMA signal.

The circuit 50L is completed by two further transistors 40 and 42 of the N-type whose gate terminals are supplied the negated direct memory access signal, DMAn. These transistors have their respective source terminals connected to ground.

The drain terminal of the transistor 40 is connected to the gate terminal of the transistor 36, and the drain terminal of the transistor 42 is connected to the gate terminal of the transistor 37.

The negated redundancy signal REDn is supplied to the pass transistor 38, and the redundancy signal REDx is supplied to the pass transistor 39.

The structure shown in FIG. 6 is completed by the switch 12 for enabling/disabling access of the local source 8 to the data bus 3, which is implemented by a circuit of the tri-state type adapted in particular to drive strongly capacitive lines and receive on its input the local bus 6 and the signal LOC_en enabling/disabling the path between the local source 8 and the data bus 3. As previously explained, the signal LOC is generated from the timing means 45.

Figure 7A:
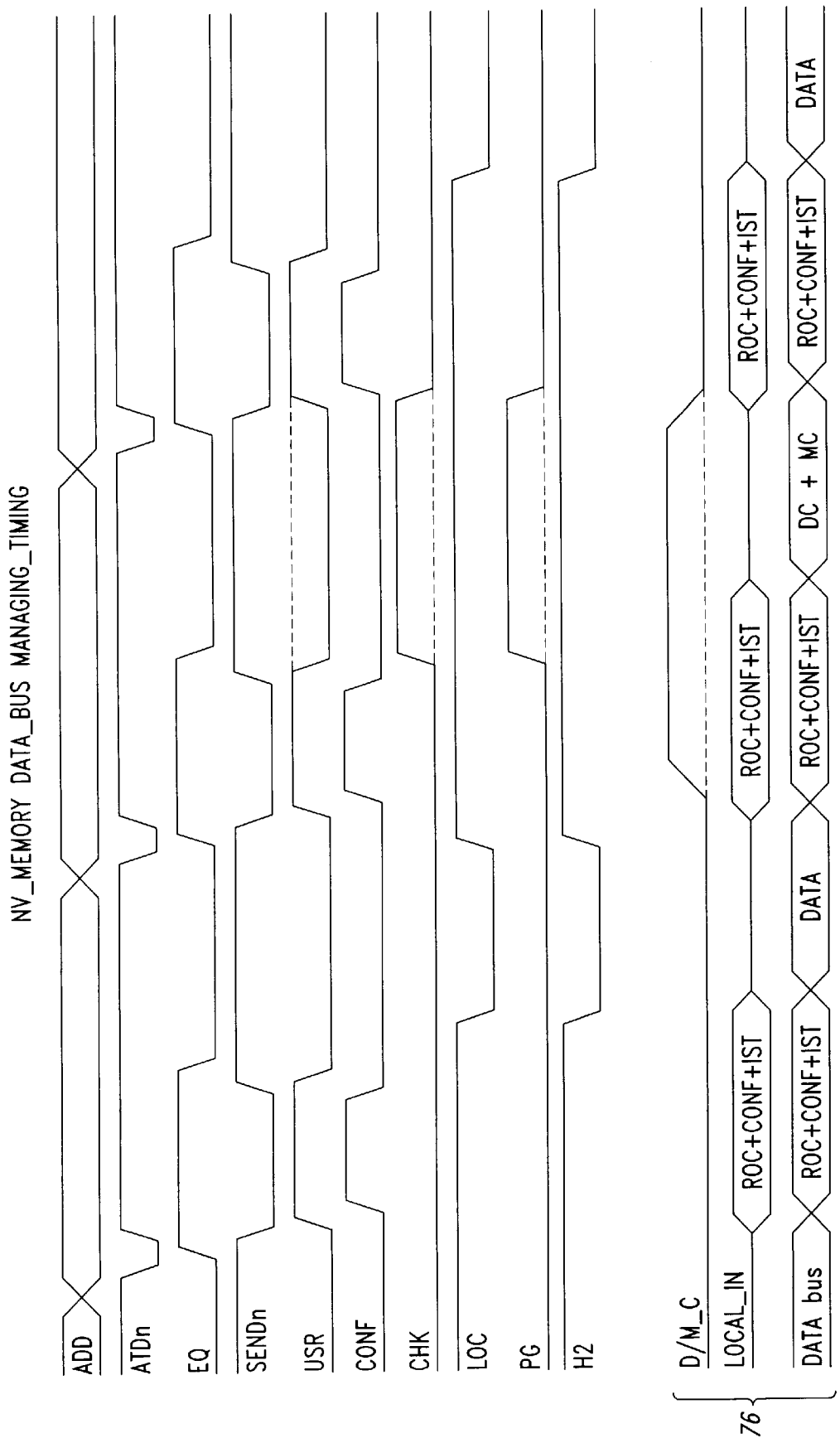
FIG. 7 is a timing diagram of the different signals produced in the memory device of this invention, highlighting the modularity and correspondence of each testing step with the protocol of this invention.
Figure 7B:
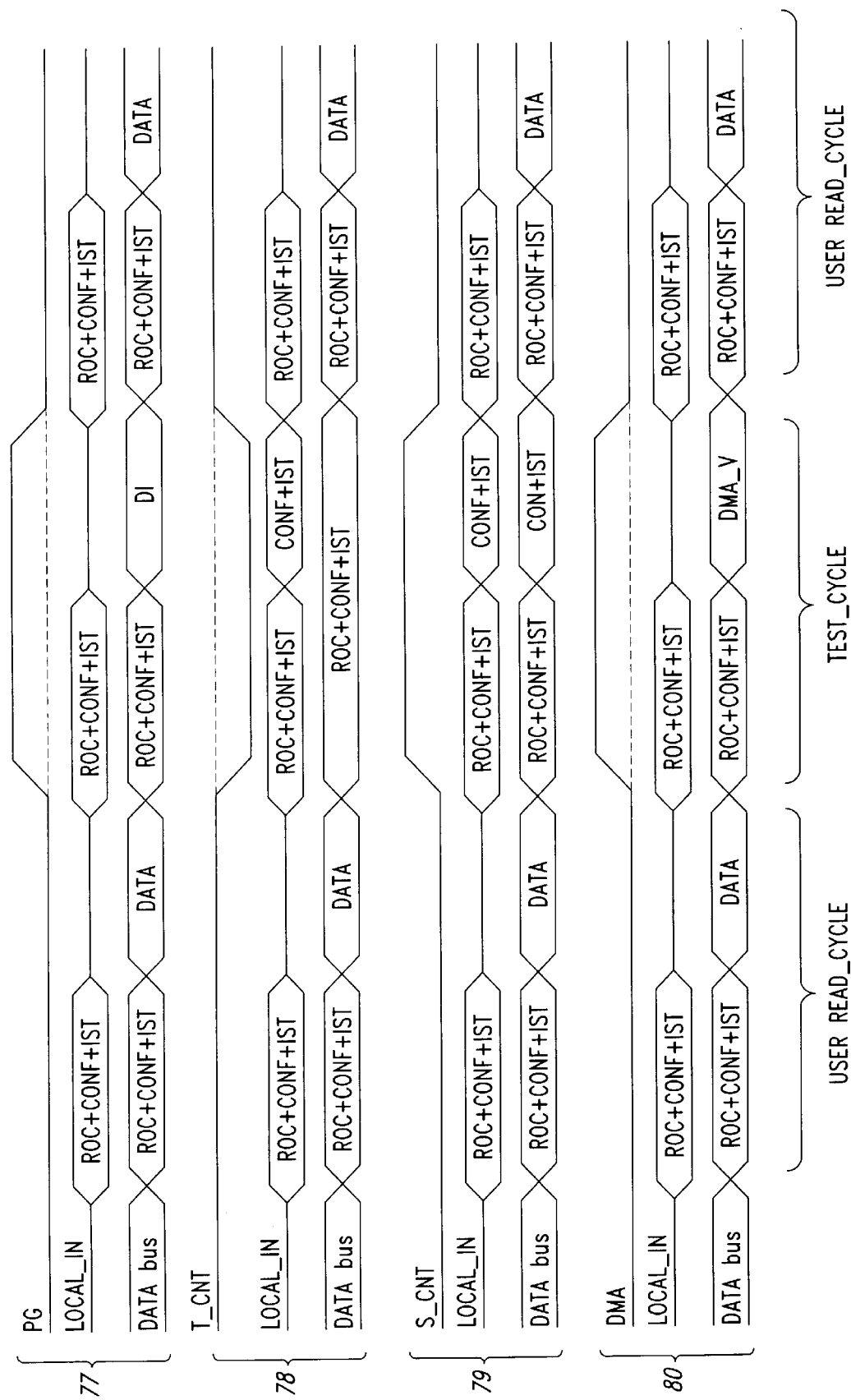

FIG. 7 shows a set of detailed graphs on the same time base which illustrate the behavior of the exercise signals for the local bus 6 and their influence on the interconnections between this bus and the data bus 3.

Thus, FIG. 7 is a timing diagram of the various signals present in the architecture 1 according to the invention.

For example, each local source 8 can access the local bus 6, which then becomes a bus shared by plural sources 8 through access enable/disable means consisting of circuits of the tri-state type. Shown at 14 in FIG. 4 are generic tri-states which interface each local source 8 to the local bus 6 for passing data over the data bus 3. The way the local bus 6 can be accessed by either the registers 62, 63 or the unit 30 via the tri-states 64, 65, 66 has been explained in detail hereinabove. Only the main signals will be specified herein below, namely:

ADD—a memory address signal;

ATD—an address transition detection signal (its negation, ATDn, being shown in the drawings);

EQ—an equalization signal;

SENDn—the negated timing signal for the delivery of data from the sources 8 in a "cyclical" manner; basically, this is the signal which enables connection of the local bus 6 to the data bus 3, and is a timed signal always present during the PC step; of course, this means that during the PC step the connection between the local bus 6 configuration and the data bus 3 will always be enabled and that the "primary" sources, such as column redundancy, or command or checks, will always be the same as transmitted from the internal bus 3 to the other end of the architecture;

USR—is a signal to request testing of the main user's data configuration; it allows enabling/disabling of the path from the local source 8 to the data bus 3;

CHKx—represents a family of possible test requests; this signal family only take a logic value of "1" after the PC step; it also allows the path from the local source 8 to the data bus 3 to be enabled/disabled;

LOC—is a signal that allows connection of the local buses to the data bus 3; it is activated whenever a local source 8 is to be connected to the data bus 3;

PG—an enable signal for the programming circuits;

DMA—a signal enabling/disabling the direct access path to the memory matrix 1.

To these typical signals of the memory device there add signals which are characteristic of the internal data sources 8.

These signals can be picked out as special function signals, generally denoted by the reference 76, program control signals, generally denoted by the reference 77, indicating signals 78 for the user, control indication signals 79, and DMA control signals 80.

Specifically, the signals are the following:

DC/MC CODE—device code and manufacturer's code signals;

LOCAL IN—local source input signals;

PG-CNT—a program control signal, CHK-CNT—a control signal to the local sources 8 at the end of the signal SENDn;

DMA—a direct memory access signal;

DATA_bus—a signal of data transmission on the data bus 3;

DI—a signal to enter programming data;

ROC (Redundancy Out Code)—signals of redundancy activity;

CONF—memory configuration signals;

IST—instruction signals.

In FIG. 3, the timing means 8 issue, therefore, two signals, designated USR and CHK, for sequentially timing the access to the bus 3 from the two local sources 8, respectively.

The signal USR enabling access to the data bus 3 from a given local source 8 is then input to the respective tri-state 14.

The actual number of tri-states 14 is same as the number of data lines in the data bus 3.

The operation of the circuit architecture according to this invention will now be described starting from an initial state wherein the memory matrix 2 reflects a normal read situation in the word mode.

The path traveled by the matrix data extends through the internal data bus 3 to the input/output terminals I/O_L and I/O_H. For simplicity, the operation will be described only in relation to the memory half-word L.

In this situation of normal reading from the memory matrix, the redundancy path, programming path, and exercise of the x8 parallelism are all disabled.

In the absence of redundancy and programming, the non-redundancy signal REDn is high and the program signal low, and the redundancy line is not connected to ground and, accordingly, left free.

Upon the program signal PG going high, thereby indicating a request for programming, the reverse data path (from the memory matrix read path) must be enabled which goes from the I/O means to the internal data bus 3, and thence to the matrix.

With PG high, and in the absence of redundancy (REDn=0), the data is allowed to flow from the programming means 7L to the data bus 3.

With PG high, and in the absence of redundancy, the switch 16 is closed and the redundancy line 2 forced to ground in order to avoid unintentional programming of the redundancy lines.

If now a direct access to the memory becomes necessary, that is with the DMA signal high, the transistor 36 would behave as a short circuit, while the transistor 37 would behave as an open circuit, and the data diverted by the I/O means directly to the internal bus 3, bypassing the output buffers OUT.

There remain to be considered the instances of a request to read from the memory in the presence of redundancy, request for programming with redundancy present, and request of direct access to the memory, also in the presence of redundancy.

Assume that a memory reading is requested with redundancy present. In this case, the signal RED would be high, the DMA signal low, and the program signal PG low.

Assuming a programming event with redundancy, that is with the signal PG high and the signal REDL high.

Assume now that a direct memory access is requested with redundancy present, that is with DMA high and RED high. In this situation, it is necessary to access the memory directly, but through its redundancy treated line, not its natural line. This will only take place on the redundancy treated line, not on the others.

Figure 8A:
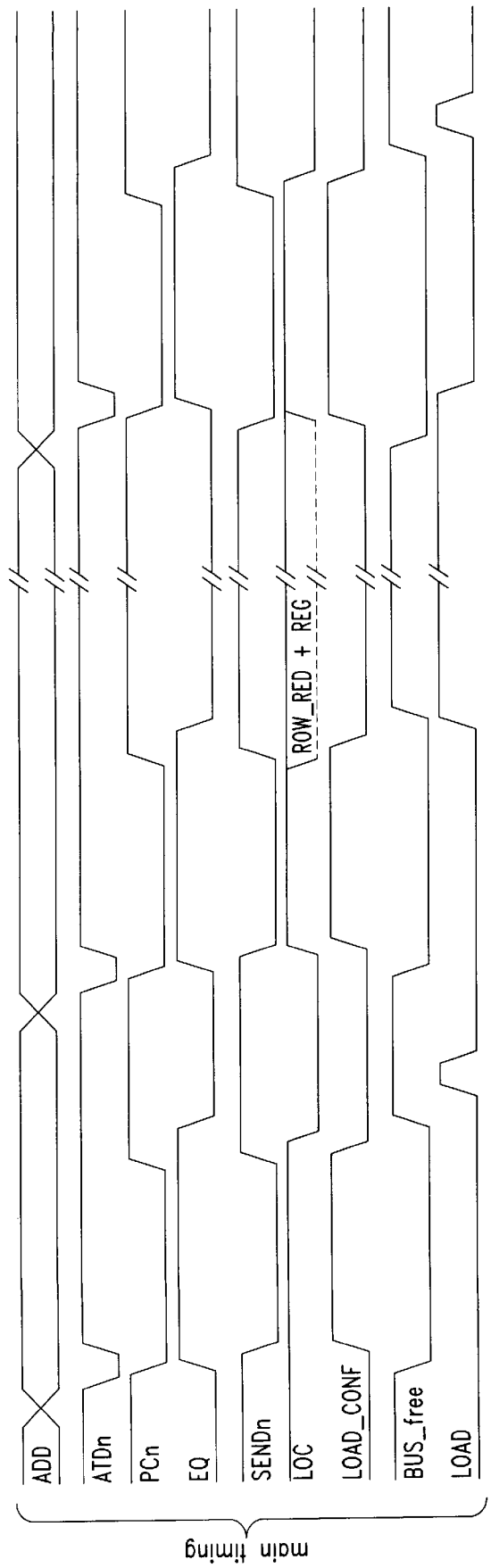
FIG. 8 illustrates in graphic form an expanded set of test operations which can be carried out using the same protocol as for the memory device of FIG. 3.
Figure 8B:
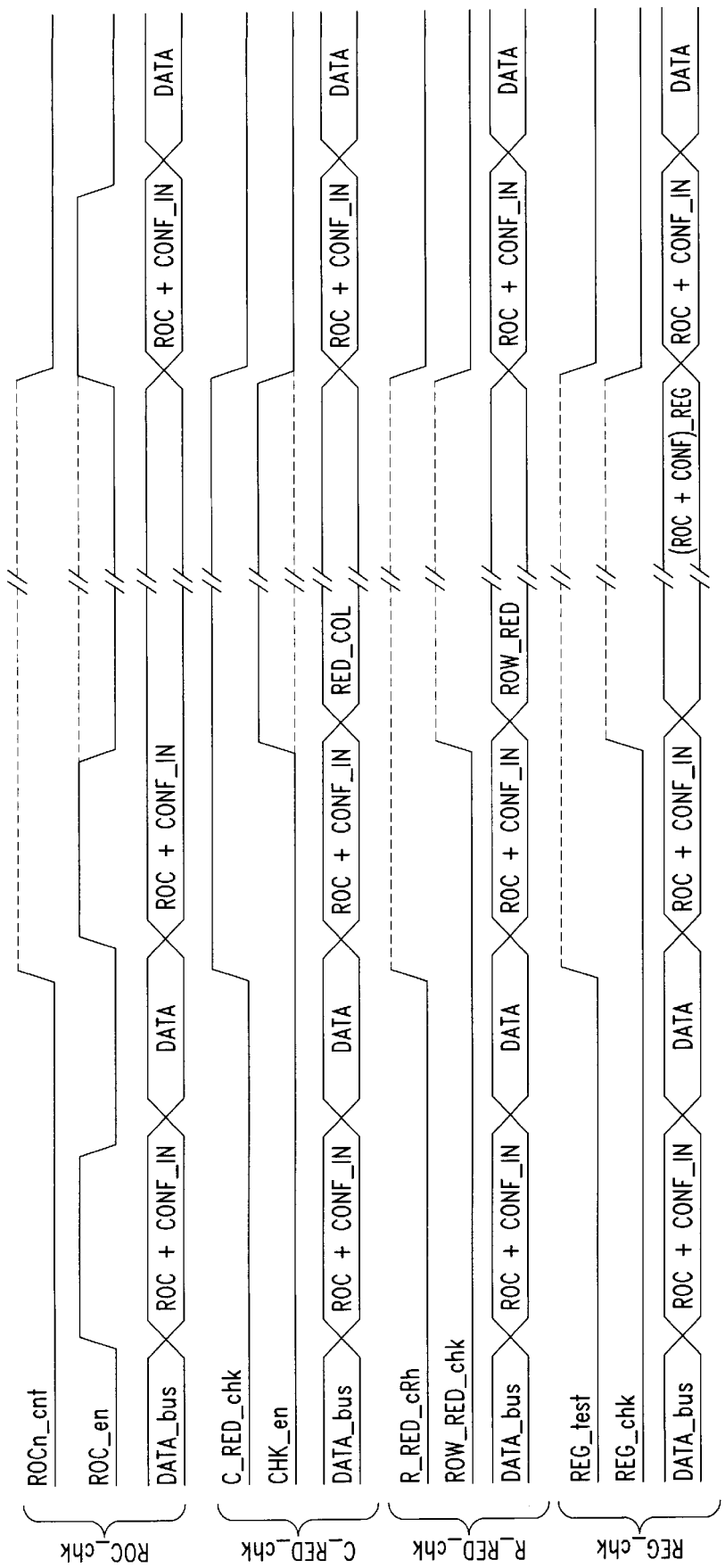
Figure 8C:
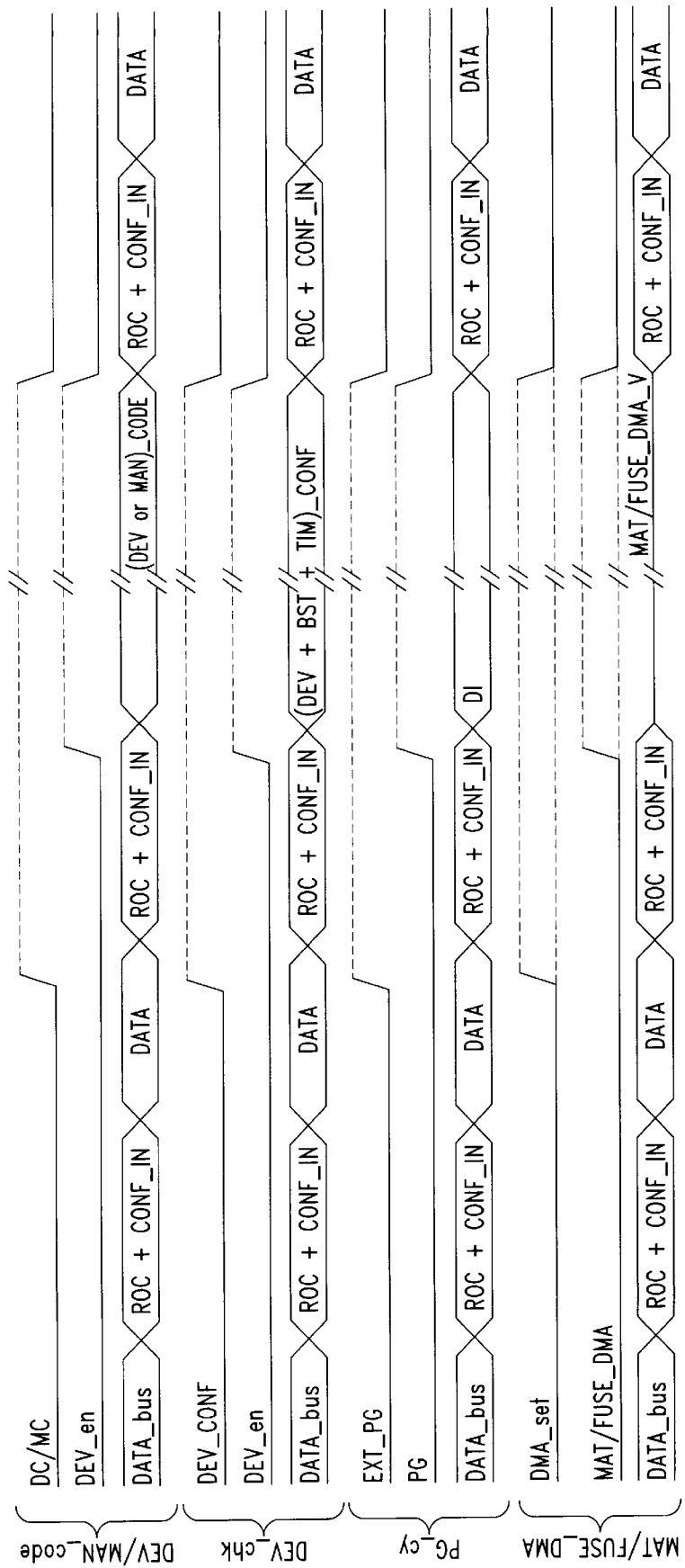
Figure 9A:
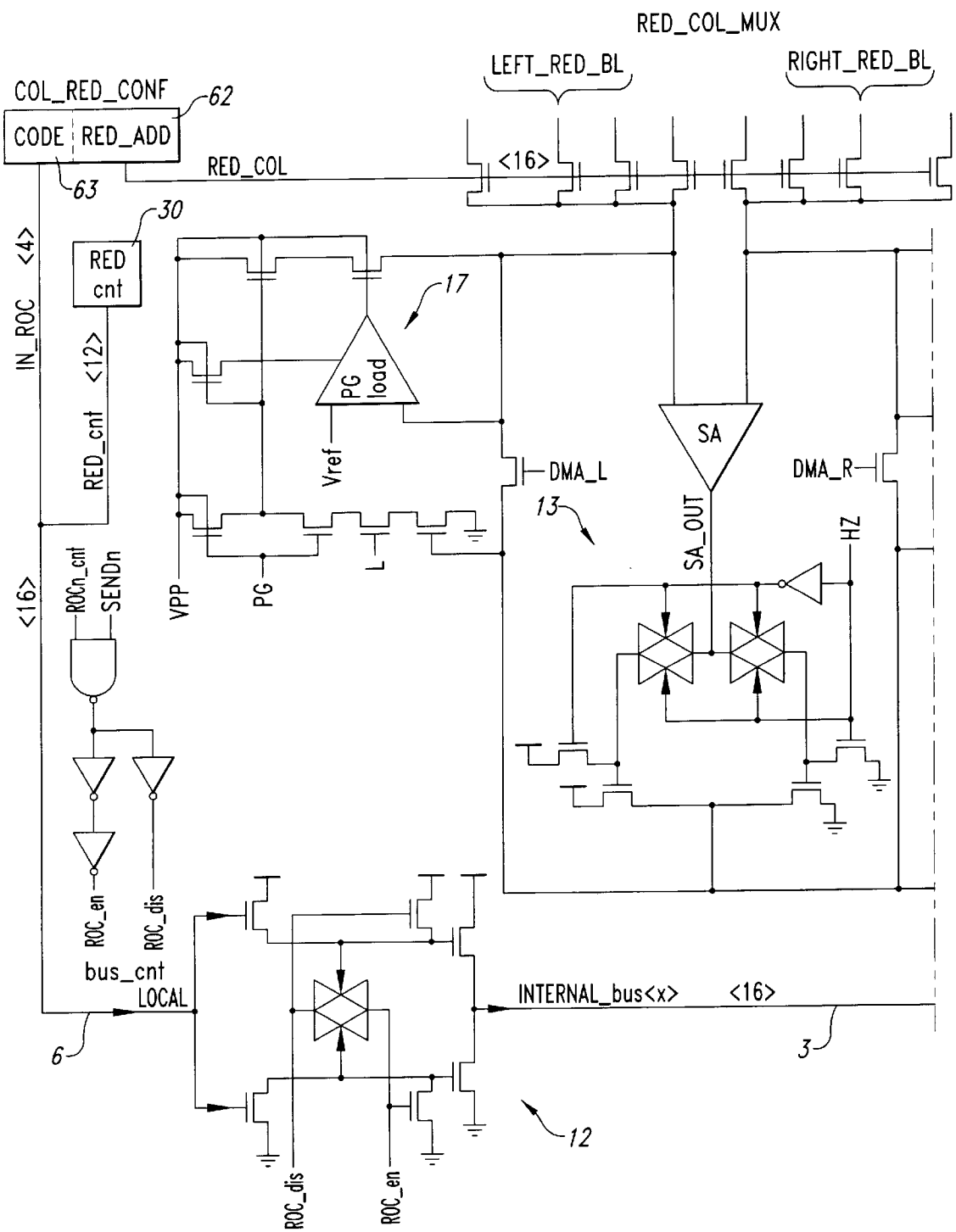
FIG. 9 is a schematic detail view of a circuit portion for column redundancy exercising which is led to the bus paths of FIG. 5.
Figure 9B:
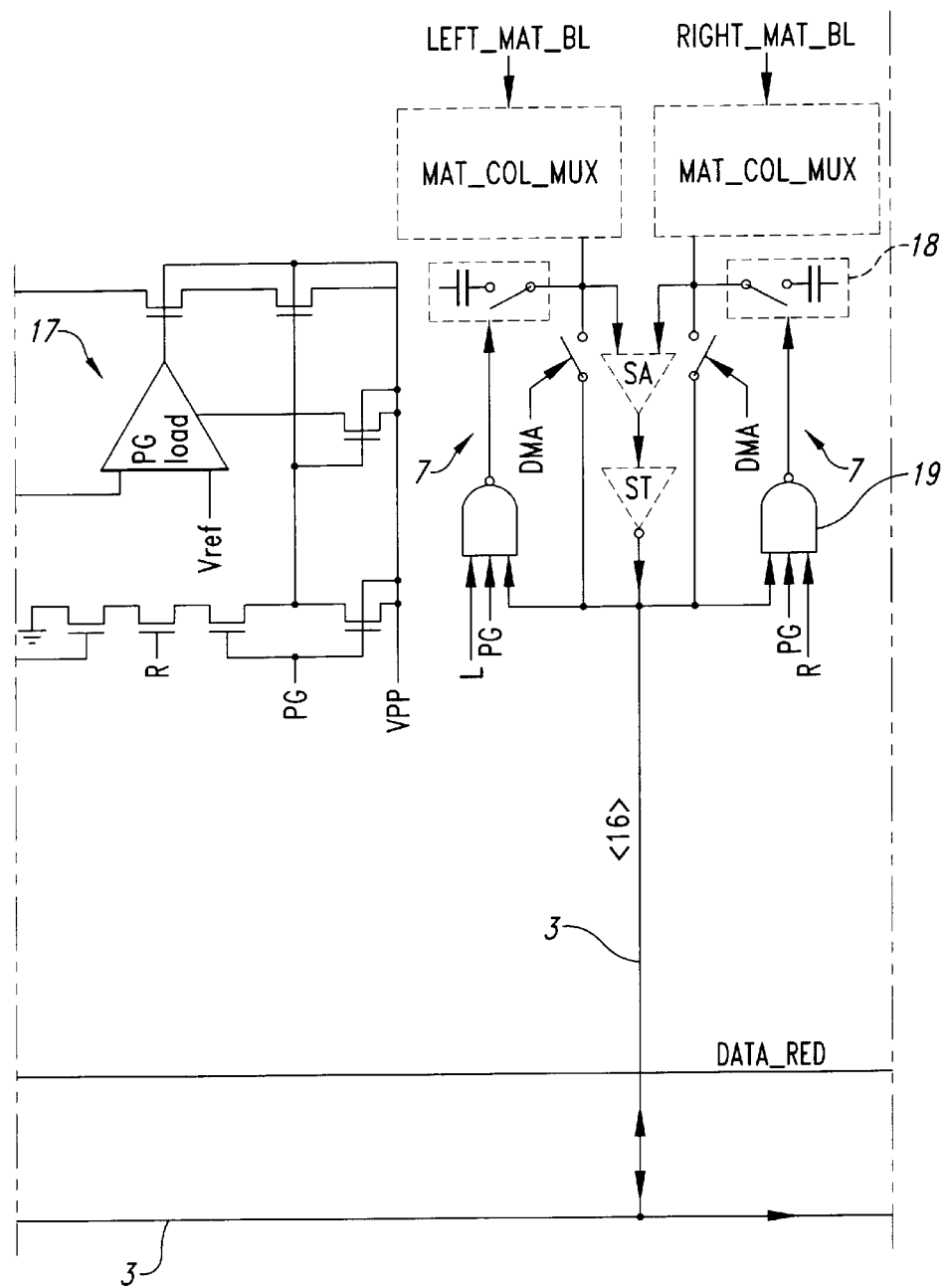
Figure 9C:
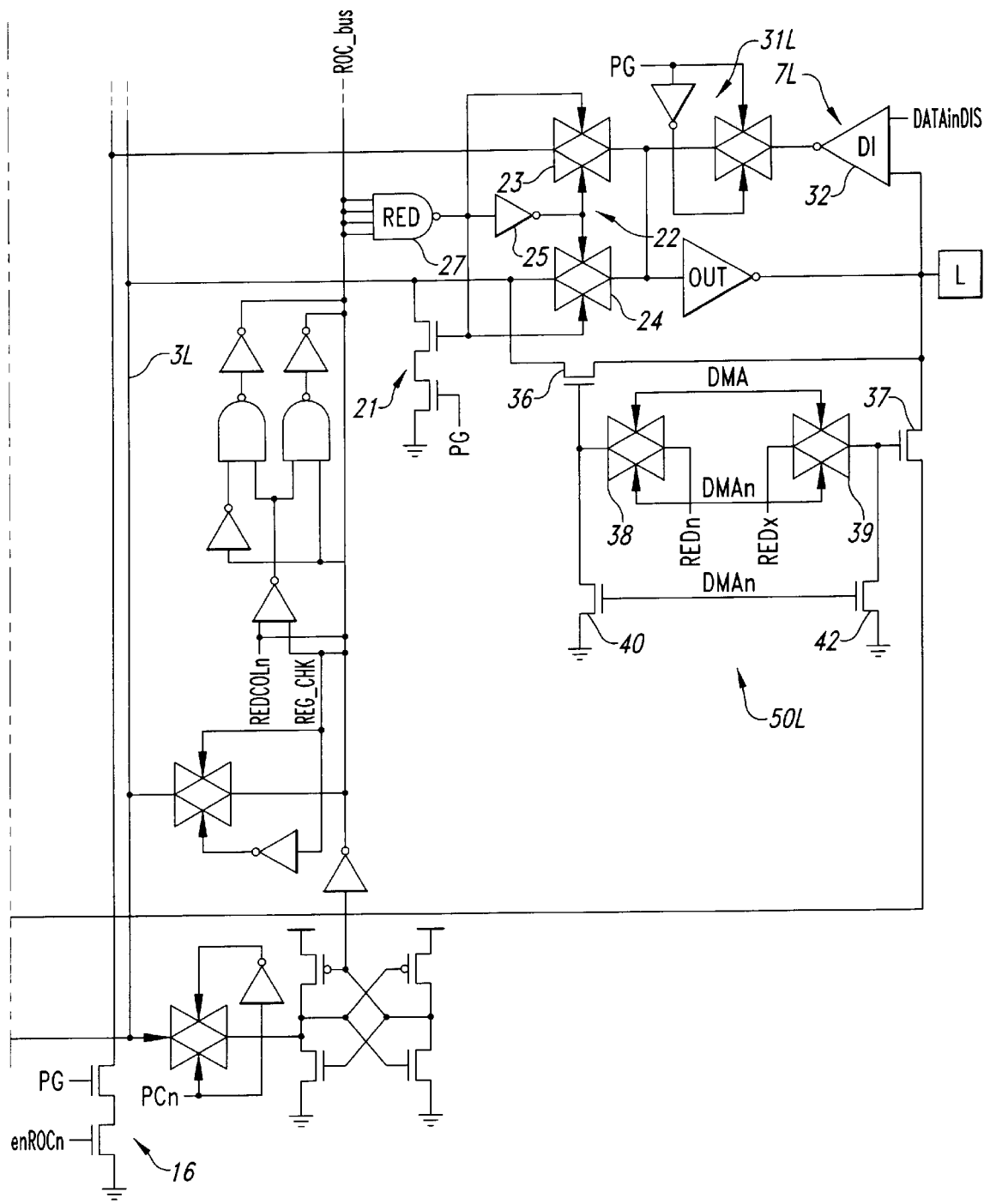
Figure 10A:
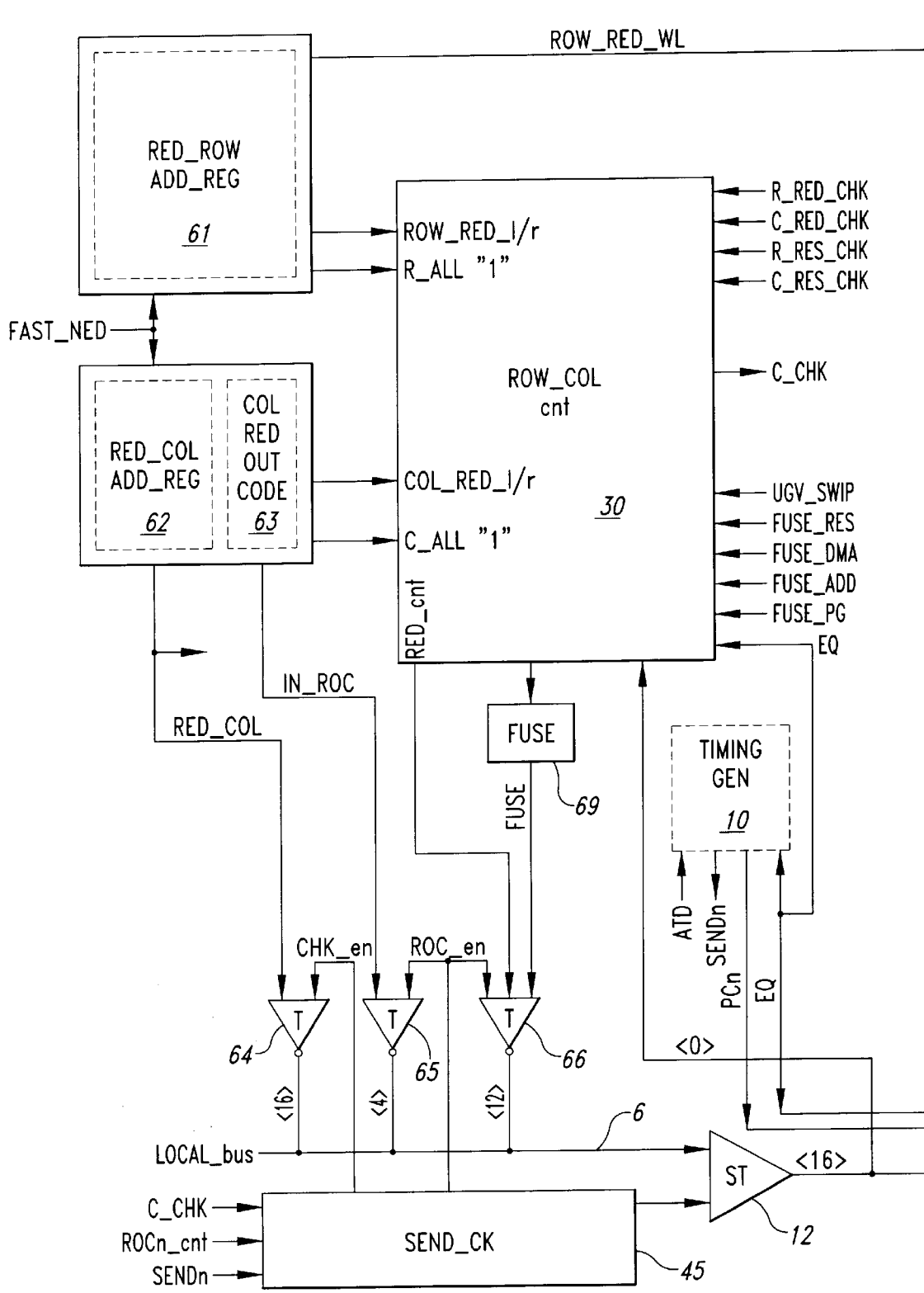
FIG. 10 is a schematic detail view, drawn to an enlarged scale, of a circuit portion of FIG. 5.
Figure 10B:
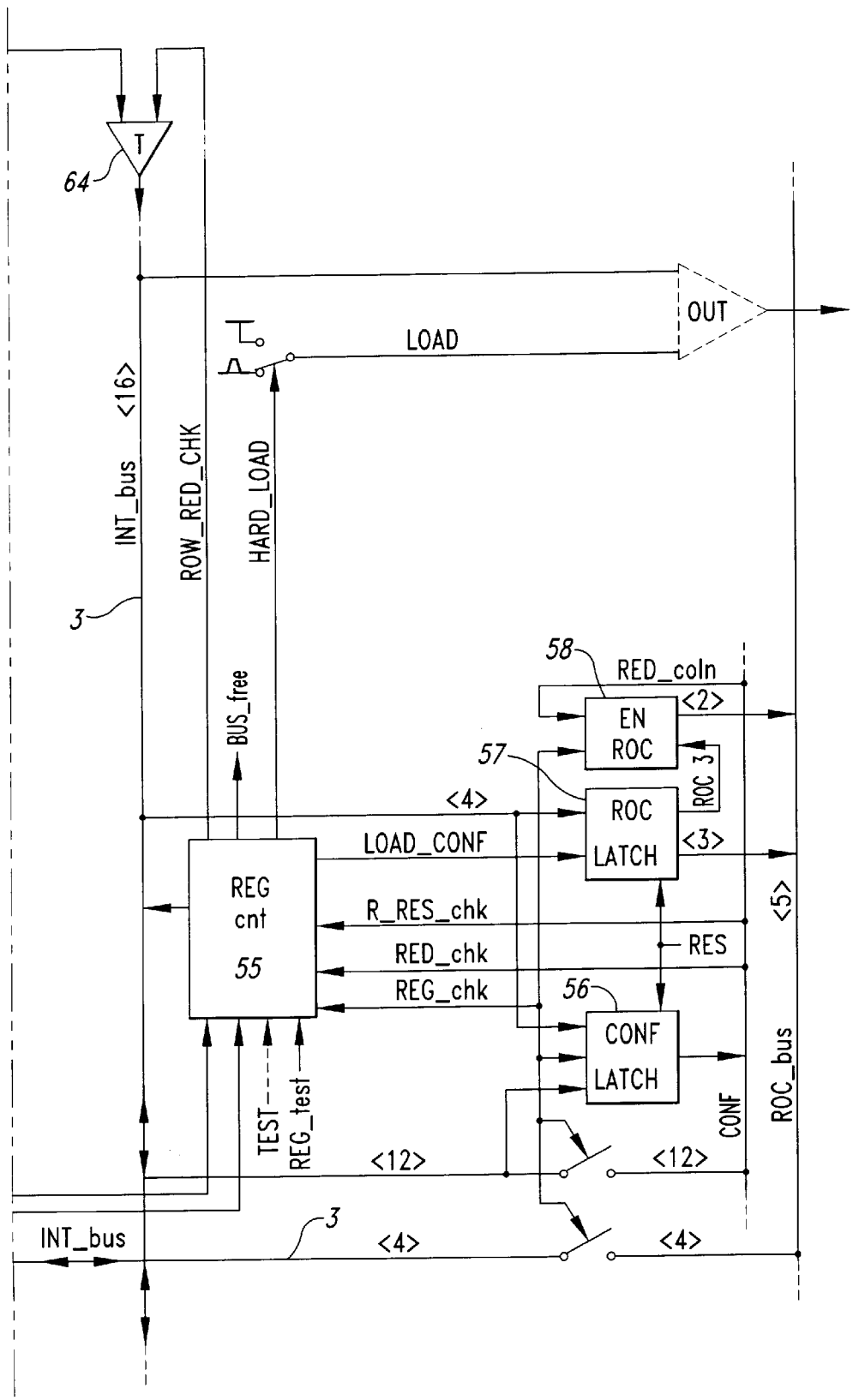

FIG. 8 shows a set of graphs on the same time base which illustrate the large variety of signals provided in the architecture of FIG. 1 to allow the implementation of an operational protocol of the time-shared type.

As previously explained in detail, the central data bus 3 is also used for testing the non-volatile memory matrix.

In fact, the data bus 3 is quite often free, and can be used in the time-sharing mode, as demanded by the various circuit portions led thereto.

All the test operations are carried out synchronously to suit the natural evolution of events within the architecture 1.

The signal ATD initiates a new read cycle.

During the precharge step, the data bus 3 is free, and the appearance of the signal SEND allows the test structures to access the central data bus 3 even in the presence of ATD.

During this step, the most urgent information is entered, and the operations that can be carried out are evaluated.

The signal LOAD enables the transfer of data to the I/O terminals. It should be noted that the data bus 3 itself is a latch type of structure in that, being isolated from the output stages, it will retain the data up to their transfer.

For example, with both signals ROC_cnt and ROC_en high, the data held in the register 57 would be transferred out through the data bus 3, and the same would occur in the register 56.

In essence, the architecture of this invention implements an exercising protocol of transfer from the local buses to the central bus with a minimum of interfacing.

The structures used for testing activities are also integrated inside the redundancy circuit portions, and accordingly, any test operations on the redundancy portions can be carried out by the same timing.

The main checking and test operations that the architecture of this invention makes possible are listed herein below.

Matrix DMA: the matrix cell DMA signal.

TIME STRETCH: guided timing modification; by acting on the signal PC, the precharge step can be altered following a test. This is a check on the read step which generates expanded signals for testing purposes.

BST_CHK: checking the boost activity.

TIM_CHK: checking the timing configuration.

FAST_NED: fast search of redundancy addresses.

DC/MC: request for manufacturer's codes.

CRA CHK: search of redundancy treated column addresses.

RRA CHK: search of redundancy treated row addresses.

ROC_code: checking the redundancy treated output code.

UGV SWIP: checking the row/column register thresholds.

REG_chk: requesting the configuration register contents.

REG_CONF_CHK & REG_ROC_CHK: checking the contents of configuration registers.

FUSE_UGV_SWIP: checking the configuration fuse thresholds.

FUSE_DMA: checking the I/V characteristic of fuses.

FISE_PG: checking the fuse programming.

Other possible checks are those relating to the row and column addresses ADD_col and ADD_row matching a configuration of all "ones", or relating to allocated row and column resources.

The architecture of this invention does solve the technical problem and affords a number of advantages, foremost among which is that the lines used for testing are practically limited to commands only, since the central data bus itself would be utilized for testing.

Additional advantages are secured by that the testing structures substantially match other redundancy or memory circuit portions. Not to be overlooked is also the modular character of all checking activities.

The architecture of this invention greatly improves the visibility of internal circuit portions from outside.

Furthermore, the substantially modular design of the various circuit portions makes the architecture of this invention easy to expand and adapt in order to fill new and prospective user's demands.

It has been found that debugging can also be improved significantly, at a relatively low cost.

In all cases, the improved flexibility in timing the time-shared test operations is beneficial both in terms of compactness and ease of fabrication of the circuit portions devoted to testing.

I claim:

1. A circuit architecture for easily carrying out tests on a non-volatile memory device having at least one matrix of memory cells, in the architecture comprising:
   a bi-directional internal data bus extending from a first end to a second end of the memory device;
   a plurality of signal sources inside said memory device;
   at least one local bus connected to the internal data bus; and
   timing means for timing access of the local bus to the data bus and selective access of the signal sources to the local bus during a same test cycle, as well as further redundancy, configuration and instruction buses independently accessible through the data bus.

2. An architecture according to claim 1, further comprising means for communicating the local bus with the data bus during a precharge step.

3. An architecture according to claim 1 wherein the local bus controls and drives the data bus in a cyclical manner during a precharge step.

4. An architecture according to claim 1, further comprising plural registers coupled to the timing means and adapted to be simultaneously updated during precharge step under control of the timing means.

5. An architecture according to claim 4 wherein said registers are coupled to and control respective independent buses during a next operational cycle to the precharge step.

6. An architecture according to claim 1, further comprising read means coupled to the timing means and the data bus, the timing means being structured to enable the read means to control the data bus subsequently to the precharge step and at each read cycle.

7. An architecture according to claim 1, further comprising:
   a bi-directional exercise line for exercising redundancy associated with said data bus;
   means of enabling/disabling data transmission on said data bus from the matrix of memory cells out; and
   means of enabling/disabling access of data from other than the matrix of memory cells to said data bus.

8. An architecture according to claim 1, further comprising tri-state logic switches connecting the signal sources and local bus with the data bus.

9. An architecture according to claim 1, further comprising means of enabling/disabling direct access to the matrix of memory cells through said data bus for transmitting data directly to or from the matrix of memory cells.

10. An architecture according to claim 1, further comprising internal resources that are visible and inspectable from outside through said data bus.

11. An architecture according to claim 1, further comprising internal resources relating to row redundancy that are visible and inspectable from outside through said data bus.

12. An architecture according to claim 1, further comprising internal resources relating to column redundancy that are visible and inspectable from outside through said data bus.

13. An architecture according to claim 1, wherein a test mode is activated after a precharge step.

14. An architecture according to claim 1, further comprising a redundant circuit portion having non-volatile elements coupled to said data bus, thereby allowing direct access of non-volatile elements of the redundant circuit portion to the matrix of memory cells.

15. An architecture according to claim 1, further comprising plural registers coupled to the data bus and adapted to store testing requests during a precharge step.

16. An architecture according to claim 15, further comprising a sense amplifier coupled to said registers via the data bus, the sense amplifier structured to read contents of said registers through the data bus and in a test mode.

17. An architecture according to claim 2, wherein the means for communicating the local bus (6) to the data bus are operated:
   cyclically during the precharge step; and
   to implement a request for testing at the end of the precharge step.

18. An architecture according to claim 1, wherein the timing means are structured to clock time-share intervals of the data bus using by signals present in a normal matrix read cycle.

19. An architecture according to claim 1, further comprising a control unit structured to route various control and test signals to and from said data bus.

20. An architecture according to claim 19, said control unit includes a logic network comprising plural logic gates structured to perform checks on circuit portions of the architecture and on the input signals to the matrix of memory cells.

21. An architecture according to claim 1, further comprising a control unit structured to perform checks on circuit portions of the architecture and on output signals from the matrix of memory cells.

22. An architecture according to claim 8, characterized in that it further comprising a redundancy circuit portion having program means which are defined by a branch-off from the exercise line and reach, via a logic gate, a switch enabling connection to the matrix of memory cells.

23. An architecture according to claim 1, further comprising means of enabling/disabling exercise of a x16 or x8 parallelism of said matrix of memory cells through said data bus.

24. An architecture according to claim 1, wherein said data bus comprises 16 lines for transmitting data to and from said matrix of memory cells.

25. An architecture according to claim 7, wherein said means of enabling/disabling access to said matrix of memory cells through said data bus comprise shift means structured to divert a path of direct access to the matrix of memory cells over to said redundancy bus, said shift means being input a memory matrix direct-access enable signal and a redundancy-present signal.

26. An architecture according to claim 19, wherein said control unit is connected to the timing means and a block that includes configuration fuses.

27. An architecture according to claim 1, wherein the data bus and the local bus are structurally independent.

28. An architecture according to claim 1, further comprising a timing block having an input that receives a signal output from said timing means and producing a signal which, when applied to a tri-state switch, enables connection between the local bus and the data bus.

29. An architecture according to claim 1, further comprising a functional bus connect between the data bus and output buffer stages, thereby connecting the matrix of memory cells to the output buffer stages.

30. An architecture according to claim 1, wherein the data bus and the redundancy, configuration, and instruction buses are structurally independent.

31. A memory circuit architecture, comprising:
   a memory matrix of memory cells;
   a test circuit for testing the memory circuit architecture;
   a local bus connected to the testing circuit;
   a bi-directional internal data bus; and
   a control circuit structured to connect the memory matrix with the data bus during a data transfer mode to enable data to be transferred between the memory matrix and the data bus and structured to connect the test circuit and local bus to the data bus during a test mode to enable the testing circuit to access the data bus via the local bus.

32. The memory circuit architecture of claim 31 wherein the control circuit includes:
   a data switch connecting the memory matrix with the data bus;
   a test switch connecting the local bus with the data bus; and
   a timing circuit structured to close the data switch during the data transfer mode to enable data to be transferred between the memory matrix and the data bus and structured to close the test switch during a test mode to enable the testing circuit to access the data bus via the local bus and the test switch.

33. The memory circuit architecture of claim 31 wherein the test circuit includes a configuration module for storing configuration data for the memory matrix, the configuration data being accessable from the configuration module during the test mode via the local bus and the data bus.

34. A method of controlling a memory device that includes a memory matrix of memory cells, a data bus, and a test circuit for testing the memory device, the method comprising:
   connecting the memory matrix with the data bus during a data transfer mode to enable data to be transferred between the memory matrix and the data bus; and
   connecting the test circuit to the data bus during a test mode to enable the testing circuit to access the data bus.

35. The method of claim 34, further comprising:
   detecting an address transition in an address line;
   connecting the test circuit to the data bus in response to detecting the address transition; and
   connecting the memory matrix to the data bus after disconnecting the test circuit from the data bus.

* * * * *